(12) United States Patent
Bedell et al.

(10) Patent No.: US 9,064,722 B2
(45) Date of Patent: Jun. 23, 2015

(54) BREAKDOWN VOLTAGE MULTIPLYING INTEGRATION SCHEME

(75) Inventors: Stephen W. Bedell, Wappingers Falls, NY (US); Bahman Hekmatshoartabari, White Plains, NY (US); Devendra K. Sadana, Pleasantville, NY (US); Ghavam G. Shahidi, Pound Ridge, NY (US); Davood Shahrjerdi, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 13/418,476

(22) Filed: Mar. 13, 2012

(65) Prior Publication Data

US 2013/0240893 A1   Sep. 19, 2013

(51) Int. Cl.
*H01L 27/088* (2006.01)
*H01L 21/8252* (2006.01)
*H01L 27/06* (2006.01)
*G06F 17/50* (2006.01)

(52) U.S. Cl.
CPC .......... *H01L 27/088* (2013.01); *G06F 17/5063* (2013.01); *H01L 21/8252* (2013.01); *H01L 27/0605* (2013.01)

(58) Field of Classification Search
CPC .............. H01L 21/8252; H01L 27/088; H01L 27/0605
USPC ................................. 257/190, 194
See application file for complete search history.

(56) References Cited

U.S. PATENT DOCUMENTS

| 7,321,242 | B2 | 1/2008 | Mandegaran | |
|---|---|---|---|---|
| 7,479,821 | B2* | 1/2009 | Imura | 327/538 |
| 7,491,627 | B2* | 2/2009 | Beach et al. | 438/483 |
| 7,679,104 | B2* | 3/2010 | Sato et al. | 257/190 |
| 8,368,121 | B2* | 2/2013 | Xin et al. | 257/195 |
| 2010/0307572 | A1 | 12/2010 | Bedell | |
| 2011/0284862 | A1* | 11/2011 | Zhang | 257/76 |
| 2012/0241819 | A1* | 9/2012 | Zhang | 257/195 |

OTHER PUBLICATIONS

Y. Niiyama, Normally off operation GaN-based MOSFETs for power electronics applications, Semicond. Sci. Technol., 25 (2010).

(Continued)

*Primary Examiner* — Matthew W Such
*Assistant Examiner* — Warren H Kilpatrick
(74) *Attorney, Agent, or Firm* — Louis J. Percello; Otterstedt, Ellenbogen & Kammer, LLP

(57) ABSTRACT

A circuit includes a first field effect transistor having a gate, a first drain-source terminal, and a second drain-source terminal; and a second field effect transistor having a gate, a first drain-source terminal, and a second drain-source terminal. The second field effect transistor and the first field effect transistor are of the same type, i.e., both n-channel transistors or both p-channel transistors. The second drain-source terminal of the first field effect transistor is coupled to the first drain-source terminal of the second field effect transistor; and the gate of the second field effect transistor is coupled to the first drain-source terminal of the second field effect transistor. The resulting three-terminal device can be substituted for a single field effect transistor that would otherwise suffer breakdown under proposed operating conditions.

5 Claims, 14 Drawing Sheets

(56) References Cited

OTHER PUBLICATIONS

W. Huang, Lateral Implanted RESURF GaN MOSFETs with BV up to 2.5 kV, Proceedings of the 20th International Symnposium on Power Semiconductor Devices and ICs, May 18-22, 2008.

Y. Niiyama, Si Ion Implantation into Mg-Doped GaN for Fabrication of Reduced . . . Effect Transistors, Japanese Journal of Applied Physics, vol. 47, No. 7, pp. 5409-5416, 2008.

Z. Li, Drift region optimization in high-voltage GaN MOS-gated HEMTs, Phys. Status Solidi C 8, No. 7-8, pp. 2436-2438 (2011).

H. Ishida, Unlimited High Breakdown Voltage by Natural Super Junction of Polarized Semiconductor, IEEE Electron Device Letters, vol. 29, No. 10, Oct. 2008.

Hidetoshi Ishida, GaN-based Natural Super Junction Diodes with Multi-channel Structures, IEEE Internationl Electron Devices Meeting, Dec. 15-17, 2008.

T. Ueda, Polarization engineering in GaN power transistors, Phys. Status Solidi B 247, No. 7, pp. 1735-1739 (2010).

Shreepad Karmalkar, RESURF AlGaN/GaN HEMT for High Voltage Power Switching, IEEE Electron Device Letters, vol. 22, No. 8, Aug. 2001.

Jin-Ping Ao, et al. A monolithic Cockcroft-Walton voltage multiplier based on AlGaN/GaN HFET structure,phys. stat. sol. (c) 4, No. 7, 2654-2657, 2007.

A. Sattu, et al. Low loss AlInN/GaN Monolithic Microwave Integrated Circuit Switch,978-1-61284-244-8/11/2011 IEEE.

José V. Siles, et al. Capabilities of GaN Schottky Multipliers for LOPower Generation . . . Bands, 19th Intern'l Symposium on Space Terahertz Technology, Groningen, Apr. 28-30, 2008.

W. E. Hoke, et al.Monolithic integration of silicon CMOS and GaN transistors in a current mirror circuit,J. Vac. Sci. Technol. B 30(2), Mar./Apr. 2012.

S. Mandegaran, et. al. "A Breakdown Voltage Doubler for High Voltage Swing Drivers", IEEE 2004 Custom Integrated Circuits Conference.

D. Li, et. al. "Efficient breakdown voltage doubler for 10 Gbit=s SiGe modulator drivers", Electronics Letters Feb. 3rd, 2005 vol. 41 No. 3.

X. Yaunbin, et. al., "Monolithically integrated enhancement/depletion-mode AlGaN/GaN HEMT D . . . fluorine plasma treatment", Journal of Semiconductors, vol. 32, No. 6, Jun. 2011.

T. Tanaka, et. al. "Highly Efficient GaN Power Transistors . . . Voltages", 2010 10th IEEE Intern'l Conference on Solid-State and Integrated Circuit Technology, Dec. 2010.

Stephen W. Bedell et al., unpublished U.S. Appl. No. 13/418,438, filed Mar. 13, 2012, Gallium Nitride Superjunction Devices.

Stephen W. Bedell et al., unpublished U.S. Appl. No. 13/418,921, filed Mar. 13, 2012, Monolithic High Voltage Multiplier.

\* cited by examiner

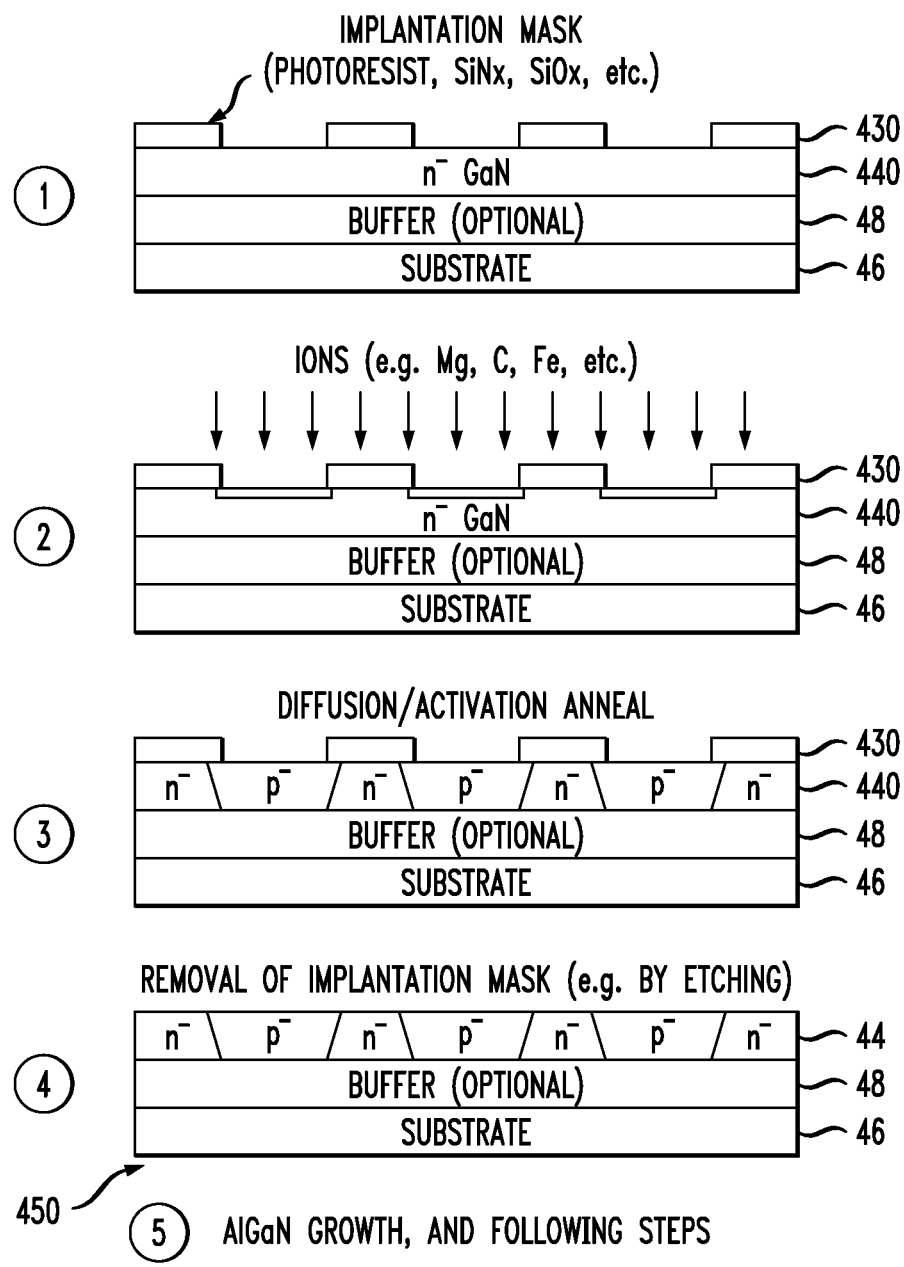

BREAKDOWN VOLTAGE MULTIPLYING INTEGRATION SCHEME

FIELD OF THE INVENTION

The present invention relates to the electrical and electronic arts, and, more particularly, to electronic circuitry and the like.

BACKGROUND OF THE INVENTION

For operation under large DC current loads, conventional voltage multiplying circuits, such as the Cockcroft-Walton (CW) AC-to-DC converter shown in FIG. 11, require large capacitance values that cannot be implemented by solid-state devices unless impractically large device areas are used. The CW is made up of a voltage multiplier ladder network of capacitors 1102, 1104, 1106, 1108 and diodes 1110, 1112, 1114, 1116 to generate high voltages. The CW is attached to an AC input voltage 1118. At the time when the AC input voltage 1118 reaches its negative pole the leftmost diode 1110 is allowing current to flow from the ground into the first capacitor 1102, charging it up. When the same AC signal reverses polarity, current flows through the second diode 1112 charging up the second capacitor with both the positive end from AC source and the first capacitor, charging the second capacitor 1106 to twice the charge held in the first. With each change in polarity of the input, the capacitors add to the upstream charge and boost the voltage level of the capacitors downstream, towards the output 1120.

As a result of the required large capacitor values, despite the availability of high voltage diodes, it may not be practical to implement these conventional voltage multiplying circuits as integrated circuits. For example, assume 10 nF metal-insulator-metal capacitors fabricated with 2 µm silicon dioxide dielectric layers having a large area of 6 cm$^2$, allowing a breakdown voltage of 2.5 KV. Further, assume GaN Schottky diodes with the same breakdown voltages of 2.5 KV. Under such assumptions, voltage multiplication from 2.5 KV (peak-to-peak) to 5 KV (using a 2 stage multiplier) and 10 KV (using a 4 stage multiplier) is expected, under 75 KHz and 500 KHz operation, respectively. Although it is possible in principle to implement such a voltage multiplier as an integrated circuit, the area consumed by the high voltage capacitors is impractically large for typical applications.

SUMMARY OF THE INVENTION

Principles of the invention provide techniques for a breakdown voltage multiplying integration scheme. In one aspect, an exemplary circuit includes a first field effect transistor having a gate, a first drain-source terminal, and a second drain-source terminal. The first field effect transistor includes one of an n-channel transistor and a p-channel transistor. Also included is a second field effect transistor having a gate, a first drain-source terminal; it is of the same type (i.e., both n-channel transistors or both p-channel transistors). The second drain-source terminal of the first field effect transistor is coupled to the first drain-source terminal of the second field effect transistor; and the gate of the second field effect transistor is coupled to the first drain-source terminal of the second field effect transistor.

In another aspect, another exemplary circuit includes a first field effect transistor having a gate, a first drain-source terminal, and a second drain-source terminal. The first field effect transistor includes one of an n-channel transistor and a p-channel transistor. Also included is a second field effect transistor having a gate, a first drain-source terminal, and a second drain-source terminal; it is of the same type (i.e., both n-channel transistors or both p-channel transistors). The second drain-source terminal of the first field effect transistor is coupled to the first drain-source terminal of the second field effect transistor; and the gate of the second field effect transistor is coupled to the gate of the first field effect transistor.

In still another aspect, an exemplary method includes determining that a single field effect transistor in a proposed circuit design will suffer breakdown under proposed operating conditions. The single field effect transistor has a gate connected to a first node in the proposed circuit design, a drain connected to a second node in the proposed circuit design, and a source connected to a third node in the proposed circuit design. Another step includes substituting for the single field effect transistor an equivalent circuit, the equivalent circuit in turn includes a first field effect transistor having a gate, a drain, and a source; and a second field effect transistor having a gate, a drain, and a source. The source of the first field effect transistor is coupled to the drain of the second field effect transistor; the gate of the second field effect transistor is coupled to the drain of the second field effect transistor; the drain of the first field effect transistor is connected to the second node; the gate of the first field effect transistor is connected to the first node; and the source of the second field effect transistor is connected to the third node.

In yet another aspect, an exemplary method includes determining that a single field effect transistor in a proposed circuit design will suffer breakdown under proposed operating conditions. The single field effect transistor has a gate connected to a first node in the proposed circuit design, a drain connected to a second node in the proposed circuit design, and a source connected to a third node in the proposed circuit design. A further step includes substituting for the single field effect transistor an equivalent circuit. The equivalent circuit in turn includes a first field effect transistor having a gate, a drain, and a source; and a second field effect transistor having a gate, a drain, and a source. The source of the first field effect transistor is coupled to the drain of the second field effect transistor; the gate of the second field effect transistor is coupled to the gate of the first field effect transistor; the gates of the first and second field effect transistors are coupled to the first node; the drain of the first field effect transistor is coupled to the second node; and the source of the second field effect transistor is coupled to the third node.

Some aspects are directed to design structures for breakdown voltage multiplying integration circuits as described herein.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

Techniques of the present invention can provide substantial beneficial technical effects. For example, one or more embodiments may provide one or more of the following advantages:

Providing a higher breakdown voltage than could be achieved by an individual device Providing a higher drive current than could be achieved by an individual device Providing a lower off current than could be achieved by an individual device These and other features and advantages of the present invention will become apparent from the following detailed description of illustrative embodiments thereof, which is to be read in connection with the accompanying drawings.

BRIEF DESCRIPTION OF THE DRAWINGS

FIG. 3 is a flow diagram showing an exemplary process for fabricating the high electron mobility transistor structure of FIG. 2;

DETAILED DESCRIPTION OF PREFERRED EMBODIMENTS

Figure 1:
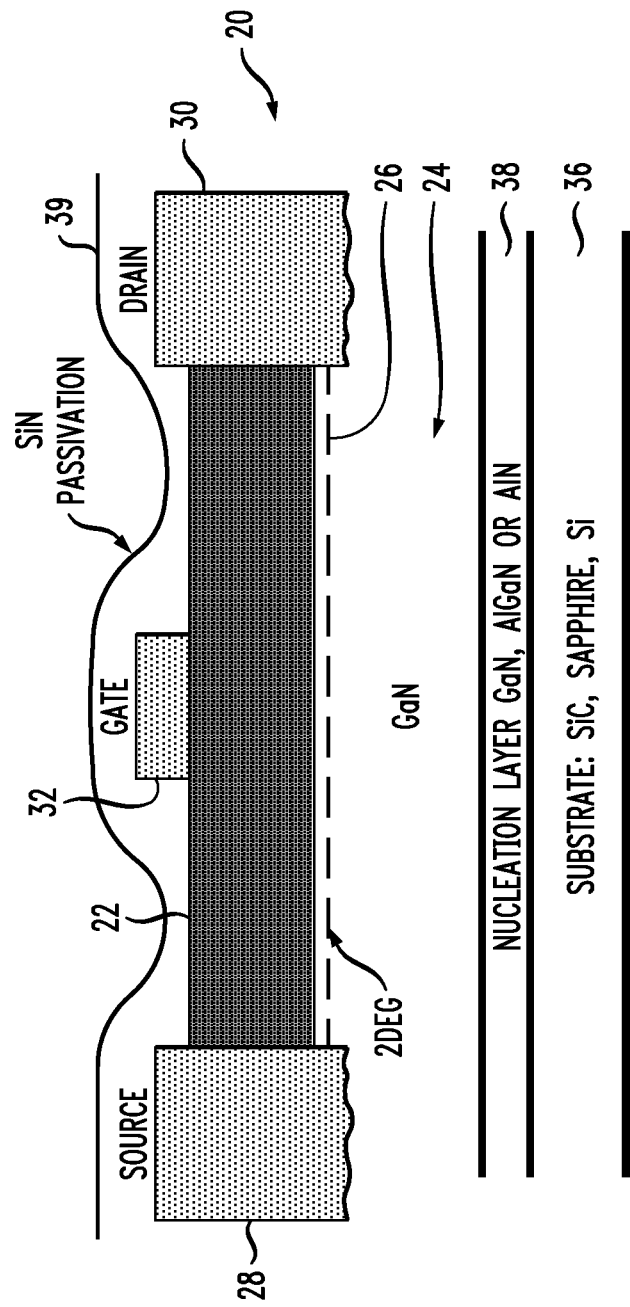
FIG. 1 shows a schematic illustration of a prior art GaN high electron mobility transistor.

As noted above, for operation under large DC current loads, conventional voltage multiplying circuits, such as the CW AC-to-DC converter, require large capacitance values that cannot be implemented by solid-state devices unless very large device areas are used. For example, assume 10 nF metal-insulator-metal capacitors fabricated with 2 μm silicon dielectric layers having a large area of 6 cm$^2$, allowing a breakdown voltage of 2.5 KV. Further, assume GaN Schottky diodes with the same breakdown voltages of 2.5 KV. Under such assumptions, voltage multiplication from 2.5 KV (peak-to-peak) to 5 KV (using a 2 stage multiplier) and 10 KV (using a 4 stage multiplier) is expected, under 75 KHz and 500 KHz operation, respectively. However, the capacitor area of 6 cm$^2$ is very large and impractical for typical applications. Such large areas are needed because a sufficiently thick dielectric material is needed to sustain the high voltages, therefore limiting the value of capacitance per area that can be achieved. High-k dielectric materials can be used to achieve higher capacitance per area and therefore allow lower capacitor areas. For example, a 10 nF metal-insulator-metal capacitor can be fabricated with 2 μm thick HfO$_2$ dielectric and an area of 1 cm$^2$. Although the reduction in the capacitor area with using high-k dielectrics is substantial, the capacitor area is still too large for some applications.

With conventional devices, larger current loads (desired values are several amperes) would either require larger capacitors (which may not be practical or very challenging with solid-state devices unless impractically large areas are used) or higher operation frequencies (which may not be practical or very challenging at such high operation voltages). One or more embodiments advantageously provide circuit structures that allow the multiplication of the device breakdown voltage (therefore allowing operation at higher voltages and currents), without requiring high-frequency switching. These circuits can be fabricated monolithically using standard semiconductor fabrication technology. Examples of the covered device technology include but are not limited to high voltage Si, SiC and GaN metal-insulator-semiconductor (MIS) field-effect transistors, high-electron-mobility transistors (HEMT) or MIS-HEMT devices.

Prior to describing these circuit structures in detail, certain high electron mobility transistor structures and Schottky diodes, which are non-limiting examples of devices that can be used in these circuit structures, will first be described.

High electron mobility transistors have been developed that generate high mobility electrons through the use of heterojunctions. Gallium nitride devices are useful for high power, high frequency switching because of the high critical breakdown electric field and high saturation velocity of carriers in gallium nitride (GaN), allowing for improved device breakdown voltages without compromising the specific on-resistance of the device. The large bandgap of gallium nitride also allows for device operation at high temperatures.

The schematic structure of a GaN high electron mobility transistor (HEMT) is shown in FIG. 1. The transistor 20 includes a layer of aluminum gallium nitride 22 adjoining a gallium nitride layer 24. A conductive channel 26 formed by 2D electron gas (2DEG) is formed between the source 28 and drain 30. The gate 32 adjoins the aluminum gallium nitride layer 22 in the illustrated transistor, though an insulator layer (not shown) may be provided beneath the gate 32 to form a metal-insulator-semiconductor (MIS) HEMT. The GaN layer is formed on a substrate 36 of, for example, silicon, silicon carbide or sapphire. A nucleation layer 38 is provided between the gallium nitride layer 24 and the substrate in the depicted transistor. The nucleation layer may be formed of a material such as gallium nitride, aluminum gallium nitride or aluminum nitride. A passivation layer 39 is provided on the structure. The passivation layer is formed of silicon nitride in the HEMT of FIG. 1. Despite the large bandgap of gallium nitride, the breakdown voltages of GaN HEMT devices as discussed with respect to FIG. 1 are limited to 2 KV due to the premature breakdown of GaN.

GaN-on-Si Schottky diodes have been developed and offer fast switching as the reverse recovery charge is negligible. Such diodes may include a Si(111) substrate, a GaN layer, a buffer layer between the substrate and GaN layer, a passivation layer overlying the GaN layer, a guard ring, and a Schottky contact.

High electron mobility transistors are disclosed that are characterized by high breakdown voltages. In exemplary embodiments, a gallium nitride superjunction is provided between the channel and the substrate, suppressing breakdown both through the substrate and between the gate and drain. Exemplary embodiments of Schottky diode structures including doped gallium nitride superjunction layers are also disclosed.

Figure 2:
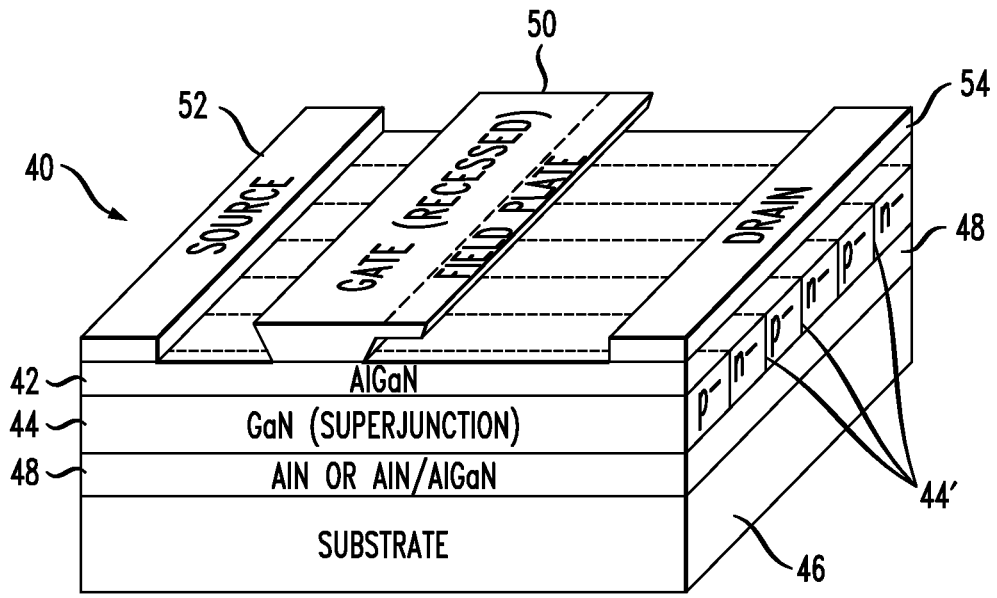
FIG. 2 shows a schematic illustration of a high electron mobility transistor structure in accordance with a first exemplary embodiment.

A first exemplary embodiment is shown in the schematic illustration provided in FIG. 2. The HEMT structure 40 shown in FIG. 2 includes a barrier layer of aluminum gallium nitride (AlGaN) 42 adjoining a gallium nitride superjunction layer 44 formed by p/n junctions 44' in the GaN. More specifically, the entirety of the GaN material between the channel and the substrate 46 is a superjunction comprised of p/n junctions 44' that extend vertically with respect to the top surface of the substrate and the bottom surface of the barrier layer. In operation, the channel is formed inside the GaN layer close to the GaN/AlGaN interface. Due to the two-dimensional quantum confinement of electrons in the channel, the channel is typically referred to as two dimensional electron gas, or 2DEG. The doped GaN p/n junctions 44' extend vertically with respect to the channel electric field. Current flows in both the p- and n-GaN parallel to each other when voltage is applied to the gate 50, also known as the gate electrode. Channel conduction mode in the n- and p-GaN layers is accumulation and inversion, respectively. The electric field set up by the GaN superjunction is vertical to the electric field set up between the gate and the drain, and also vertical to the electric field set up between the drain and the Si(111) substrate. As known from the theory of superjunctions, the spatial distribution of an electric field vertical to that set up by the superjunction is modified in such a way that the maximum value of the vertical electric field in the GaN material is reduced. As a result, the breakdown voltage is increased accordingly. This applies to both the electric field set up between the gate and the drain and the electric field set up between the gate and the Si(111) substrate.

The gate 50 adjoins the aluminum gallium nitride barrier layer 42, though a dielectric layer (not shown) may be provided beneath the gate 50 to form a metal-insulator-semiconductor (MIS) HEMT structure. The gate may optionally be recessed to further reduce the electric field on the drain side of the gate (not shown). A field plate extends from the gate and extends over the barrier layer 42. Field-plates are widely used in high voltage devices including GaN HEMTs to reduce the electric field on the drain side of the gate, and suppress premature breakdown between the gate and the drain. Source and drain electrodes 52, 54 are also formed on the AlGaN barrier layer 42. A buffer layer 48 is formed between the substrate 46 and the GaN superjunction layer 44. The buffer layer 48 in this illustrative embodiment is formed of aluminum nitride (AlN). It will be appreciated that both the barrier and buffer layers can be formed of materials other than those identified above. For example, the barrier layer can be comprised of any suitable material that will grow on gallium nitride and provide a large band gap. Other materials which may be used as the barrier layer include but are not limited to AlInN, AlGaInN, AlN/AlInN bilayer or superlattice. The buffer layer can be any material that has a smaller lattice mismatch with the substrate material compared to that of GaN with the substrate material, and therefore reduces the built-in strain in GaN.

The substrate 46 in this exemplary embodiment is preferably comprised of Si(111), although other substrate materials known to those of skill in the art such as silicon carbide (SiC), sapphire or zinc oxide (ZnO) could alternatively be employed. A GaN substrate could alternatively be used, eliminating the need for any additional GaN growth. Si(111) is the preferred substrate material because of its significantly lower cost and superior thermal conductivity. However, the growth of GaN on Si(111) is challenging due the lattice mismatch between GaN and Si(111), and buffer layers such as AlGaN or AlN are typically grown on Si(111) prior to GaN growth to reduce the lattice mismatch. The lattice mismatch between GaN and Si(111) results in mechanical strain in the GaN layer leading to the creation of structural defects in GaN after a critical strain level is reached. The defects degrade the electrical properties of the GaN layer such as carrier mobility and the critical electric field (and therefore the inherent breakdown voltage of GaN). The accumulation of the mechanical strain in GaN also results in the bowing of the substrate (and the layers grown on the substrate) and may lead to the cracking and delamination of the layers. Since the accumulated strain is increased as the thickness of the grown layers is increased, the thickness of the GaN channel material is typically limited to less than ten (10) microns. Therefore, the GaN-on-Si HEMT devices are particularly prone to breakdown through the Si substrate (i.e. breakdown between the drain and Si substrate, through the GaN channel material; hence, typically the thinner the GaN layer, the lower the breakdown voltage). The improvements disclosed herein are accordingly particularly relevant to GaN-on-Si devices which are most prone to breakdown though the substrate. Breakdown between gate and drain is in principle independent of the substrate type and is suppressed by employing a superjunction structure as disclosed herein, regardless of the type of the substrate material being used.

A second AlGaN layer may be provided beneath the GaN layer 44 to form a double heterojunction HEMT (DH-HEMT) in an alternative embodiment, in which case the layer 48 shown in FIG. 2 would actually comprise two layers, specifically the AlN buffer layer and the second AlGaN layer. Alternatively, an AlN/GaN supperlattice, an AlInN layer, an AlGaInN layer, or an InGaN layer may be used instead of the second AlGaN layer. A passivation layer is optionally provided on the structure 40 and overlies the barrier layer 42. The passivation layer is comprised of silicon nitride in this exemplary embodiment. The source 52 may overlap the gate, running over the passivation layer to overlap the channel on the drain side of the gate 50, to form a second field plate (not shown). The presence of the GaN superjunction layer 44 in the HEMT structure shown in FIG. 2 enhances the voltage sustaining level in the GaN beyond the Poisson limit and improves the breakdown voltage of the structure 40. The superjunction serves to suppress breakdown both through the substrate and between the gate and drain.

The embodiment of FIG. 2 is prepared by growing the buffer, superjunction and barrier layers on the substrate 46. Metal organic chemical vapor deposition (MOCVD), molecular beam epitaxy (MBE) and/or other techniques familiar to those of skill in the art may be employed. The superjunction can be formed by growing n-GaN, followed by masked implantation and/or diffusion to form the p-GaN layers. The n-type conductivity of GaN may arise from the presence of defects such as vacancies or Si dopant atoms in GaN. An exemplary process flow is shown in FIG. 3.

Referring to step 1 in FIG. 3, the substrate 46 has an n-GaN layer 440, the optional buffer layer 48, and an implantation mask 430 formed thereon. In step 2, ions are implanted in the n-GaN layer 440. The ions may be, for example, magnesium or zinc. In step 3, the ions are distributed within the n-GaN layer through processes known to those of skill in the art, namely diffusion and/or activation anneal in the exemplary process. Activation anneal places dopant atoms on lattice sites. Distribution of the dopant atoms is such that n-GaN regions remain in the layer 440 beneath the implantation mask. The entirety of the thickness of the GaN material is a superjunction structure following step 3. The implantation mask 430 is removed in step 4, leaving a structure 450 comprising the substrate 46, optional buffer layer 48 and GaN superjunction layer 44. It will be appreciated that the vertical p/n junctions formed in this procedure are not entirely orthogonal to the buffer layer 48 nor will they be orthogonal to the barrier layer subsequently formed thereon. Orthogonal junctions are not required. The AlGaN barrier layer 42 can thereafter be grown on the structure 450 in step 5. It will be appreciated that fabrication process as described above can be conducted on a wafer scale.

Figure 4:
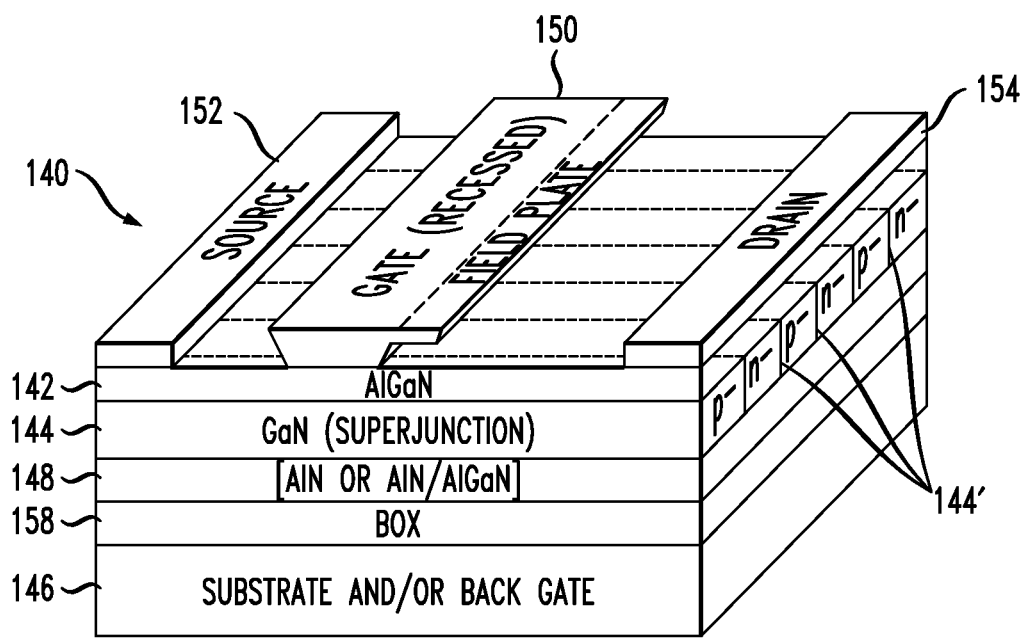
FIG. 4 shows a schematic illustration of a high electron mobility transistor structure in accordance with a second exemplary embodiment.

A further exemplary embodiment of a HEMT structure 140 is shown in FIG. 4. The structure shown in FIG. 4 includes a barrier layer of aluminum gallium nitride (AlGaN) 142 adjoining a doped gallium nitride superjunction layer 144 formed by p/n junctions 144' in the GaN. As discussed above with respect to the embodiment of FIG. 2, other large band gap materials could be employed for the barrier layer. Similar to the embodiment of FIG. 2, the entirety of the GaN material between the conductive channel and the substrate 146 is a superjunction. The doped GaN p/n junctions 144' extend vertically with respect to the channel electric field. The junctions of the n- and p-regions may be oriented as shown in FIG. 3, which is considered vertical with respect to this element. Current flows in both the p- and n-GaN parallel to each other when voltage is applied to the gate 150. The gate 150 adjoins the aluminum gallium nitride layer 142, though a dielectric layer (not shown) may be provided beneath the gate 150 to form a metal-insulator-semiconductor (MIS) HEMT structure. The gate may optionally be recessed (not shown). Source and drain electrodes 152, 154 are also formed on the AlGaN barrier layer 142. A buffer layer 148 is optionally formed between the substrate 146 and the GaN superjunction layer 144. The buffer layer 148 in this illustrative embodiment is formed of aluminum nitride (AlN). A passivation layer is optionally provided on the structure 140. The passivation layer is comprised of silicon nitride in this exemplary embodiment. The source 152 may overlap the gate, running over the passivation layer to overlap the channel on the drain side of the gate 150, to form a second field plate (not shown). In the embodiment of FIG. 4, the structure is detached from the substrate and bonded to an insulating or insulator-on-semiconductor substrate such as silicon-dioxide on Si. Such a substrate may be formed by various methods known in the art, such as thermal oxidation of the Si substrate followed by removal of the oxide from one side; deposition or growth of oxide or nitride on one side of the Si substrate; or using a Si on insulator (SOI) substrate in which a top thin Si layer has been etched away. In the case of insulator on Si, the Si substrate can serve as a back gate, which may improve the electrostatics of the transistor, including the reduction of the off-current. This may be particularly useful in the case of DH-HEMT devices. Layer transfer may be achieved by spalling or other known techniques. U.S. Pub. No. 2010/0307572 discloses layer transfer techniques applicable to fabrication of the structure 140, and is incorporated by reference herein. The presence of the GaN superjunction layer 144 in the HEMT structure shown in FIG. 4 enhances the voltage sustaining level in the GaN beyond the Poisson limit and improves the breakdown voltage of the structure 140. The superjunction serves to suppress breakdown both through the substrate and between the gate and drain. The embodiment of FIG. 4 allows for even higher breakdown voltages due to the insulating buried oxide (BOX) layer 158 that helps prevent the permeation of the depletion region into the substrate that could otherwise result in premature breakdown through the Si substrate. This embodiment is also advantageous in that it allows thinner GaN layers to be used compared to embodiment of FIG. 2, due to the presence of the BOX layer. Growing thinner GaN layers on Si is less demanding since the accumulated strain due to lattice mismatch is increased as the thickness of the GaN layer grown on Si is increased. As in the embodiment of FIG. 2, the superjunction serves to suppress breakdown both through the substrate and between the gate and drain, not just between the gate and drain. Like the other embodiment disclosed herein, the embodiment of FIG. 4 can be formed as a double heterojunction HEMT.

The p-regions forming the superjunction in GaN may be doped by impurities such as Mg and Zn. The doping levels of the p-regions may range from $5\times10^{15}$ cm$^{-3}$ to $5\times10^{17}$ cm$^{-3}$ but higher or lower doping levels are also possible. The widths of the p-regions may range from 500 nm to 5 μm but thinner or wider regions are also possible. The n-regions forming the superjunction in GaN may be doped by impurities such as Si or result from the defects present in GaN. The doping levels of the n-regions may range from $10^{15}$ cm$^{-3}$ to $5\times10^{16}$ cm$^{3}$ but higher or lower doping levels are also possible. The widths of the n-regions may range from 500 nm to 3 μm but thinner or wider regions are also possible.

GaN superjunction as formed in the manner disclosed in FIG. 3 can be employed to form diode structures. The gate and drain electrodes of the embodiments of FIGS. 2 and 4 can, for example, be electrically connected to function as diodes (not shown).

Figure 5:
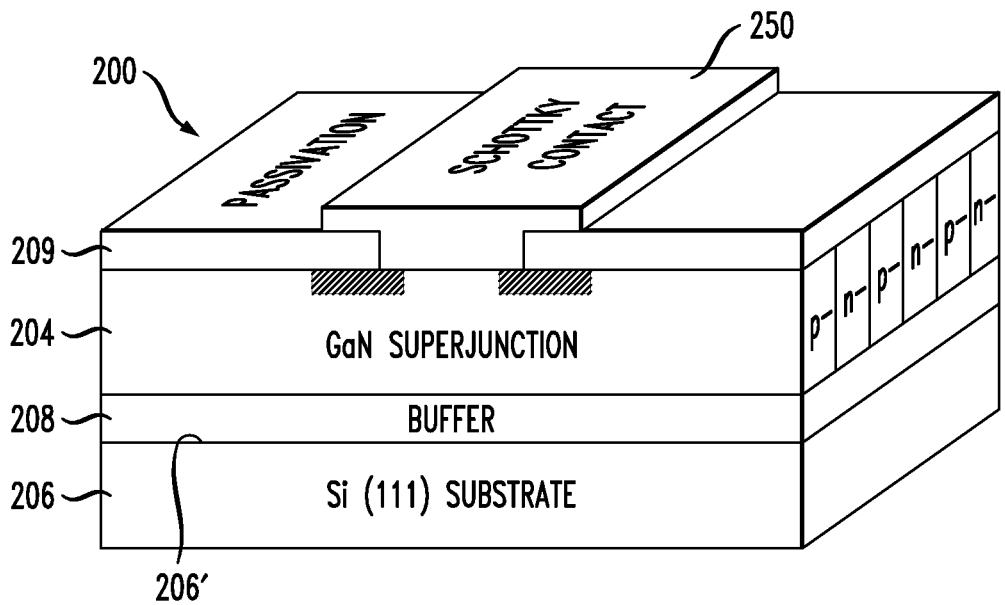
FIG. 5 shows a schematic illustration of a Schottky diode structure in accordance with a third exemplary embodiment.
Figure 6:
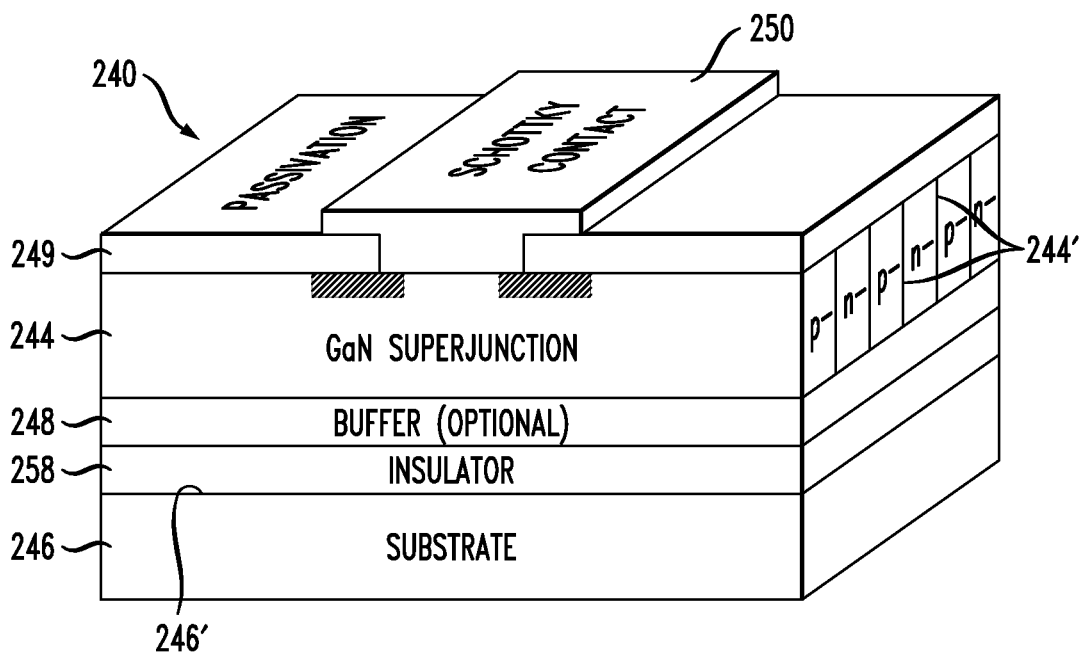
FIG. 6 shows a schematic illustration of a Schottky diode structure in accordance with a fourth exemplary embodiment.

FIGS. 5 and 6 show schematic illustrations of Schottky diode structures 200, 240 including doped gallium nitride superjunction layers. Referring first to FIG. 5, the exemplary structure includes a doped gallium nitride superjunction layer 204, a Si(111) substrate layer 206, and a buffer layer 208 therebetween. The buffer layer may comprise aluminum nitride. An ion-implanted guard ring 210 is provided in the GaN layer 210 helps prevent damage to the Schottky junction. The implantation of argon may be conducted in the fabrication of the structure 200 to create a high resistivity area. Implantation of other ions such as magnesium or zinc is an alternative approach. Argon, magnesium and zinc are non-limiting examples. Those skilled in the art will appreciate that guard rings are well known features of Schottky diodes. A passivation layer 209 is formed on the GaN layer 204. A Schottky contact 250 adjoins the doped GaN superjunction layer 204, forming a Schottky barrier. The doped GaN superjunction layer 204 is similar to those employed in the HEMT structures described above with respect to FIGS. 2, 3 and 4. It is comprised of a plurality of p- and n-regions having junctions that extend vertically between the buffer layer 208 and the passivation layer 209 or Schottky contact 250. The junctions may extend orthogonally to the direction shown in FIG. 5. As discussed above with respect to FIG. 3, the junctions are unlikely to be perpendicular with respect to the top surface 206' of the substrate layer or adjoining layers due to the manner in which they are formed. It will accordingly be appreciated that the schematic illustrations provided herein, such as FIG. 5, may not be to scale or show boundaries between elements in precise orientations. The superjunction layer 204 in this exemplary embodiment has a thickness of less than ten microns, the entire thickness comprising a superjunction structure. The substrate layer 206 in this exemplary embodiment is Si(111), though other substrate materials known to those of skill in the art may be employed.

The Schottky diode structure 240 of FIG. 6 includes substrate, insulator, doped gallium nitride superjunction and passivation layers 246, 258, 244 and 249, respectively, and an optional buffer layer 248. The doped gallium nitride superjunction layer is the same in structure as the layer 204 discussed above with respect to FIG. 5. The junctions 244' extend vertically with respect to the top surface 246' of the substrate and the bottom surface of the passivation layer. The insulator 258 may be a buried oxide (BOX) layer.

Figure 7A:
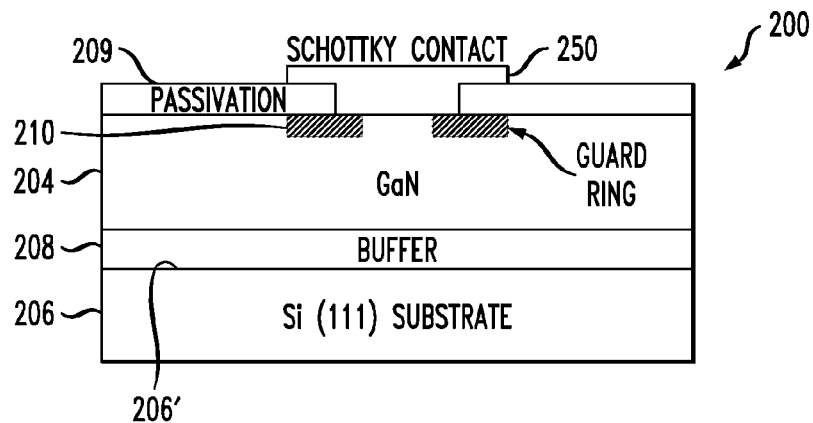
FIGS. 7A and 7B show exemplary embodiments of Schottky diode structures.
Figure 7B:
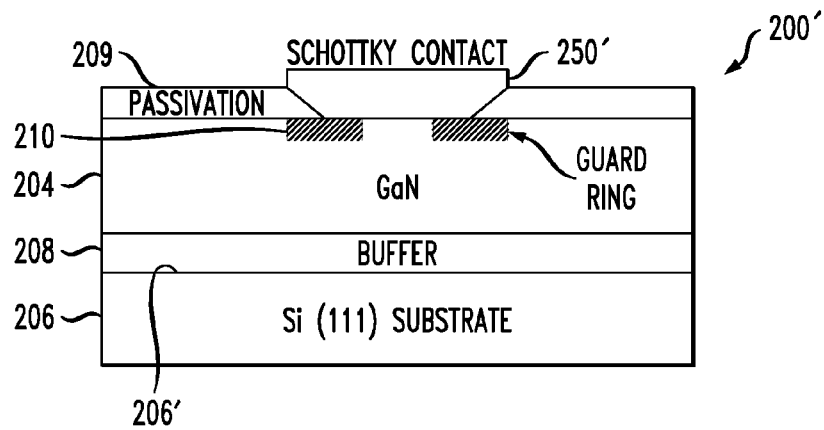

FIGS. 7A and 7B are schematic illustrations of similar Schottky diode structures. The structure 200 shown in FIG. 7A is the same structure as shown in FIG. 5 though the junctions in the doped gallium nitride superjunction layer 204 are not visible in this view. Such junctions would be visible in this view if they were formed orthogonally with respect to the directions in which the junctions in this exemplary embodiment are formed, and could resemble the vertical junctions formed in the GaN layer shown in FIG. 3. FIG. 7B shows a Schottky diode structure 200' having the same structure as the structure 200 shown in FIG. 7A except for the configuration of the Schottky contact 250' and adjoining passivation layer.

Figure 8:
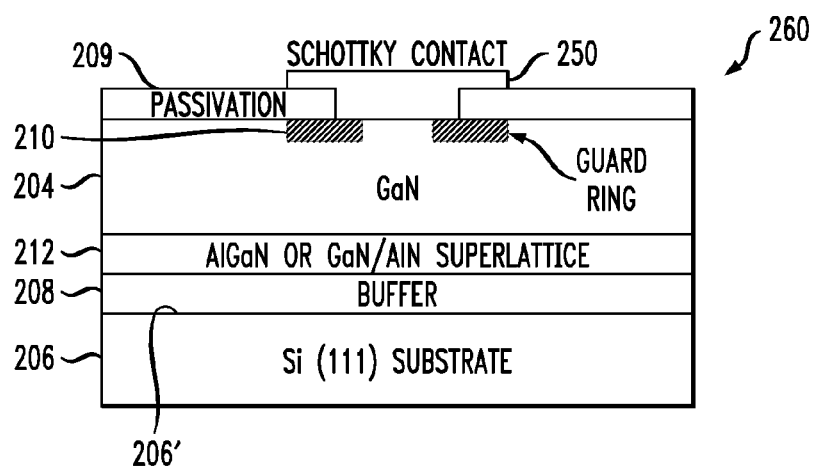
FIG. 8 shows a further exemplary embodiment of a Schottky diode structure.

FIG. 8 shows a Schottky diode structure 260 having elements in common with the structures shown in FIGS. 7A and 7B, the same reference numbers being used to designate such elements. The structure 260 further includes an AlGaN layer or a GaN/AlN superlattice layer 212 between the buffer layer 208 and the doped gallium nitride superjunction layer 204.

Figure 9:
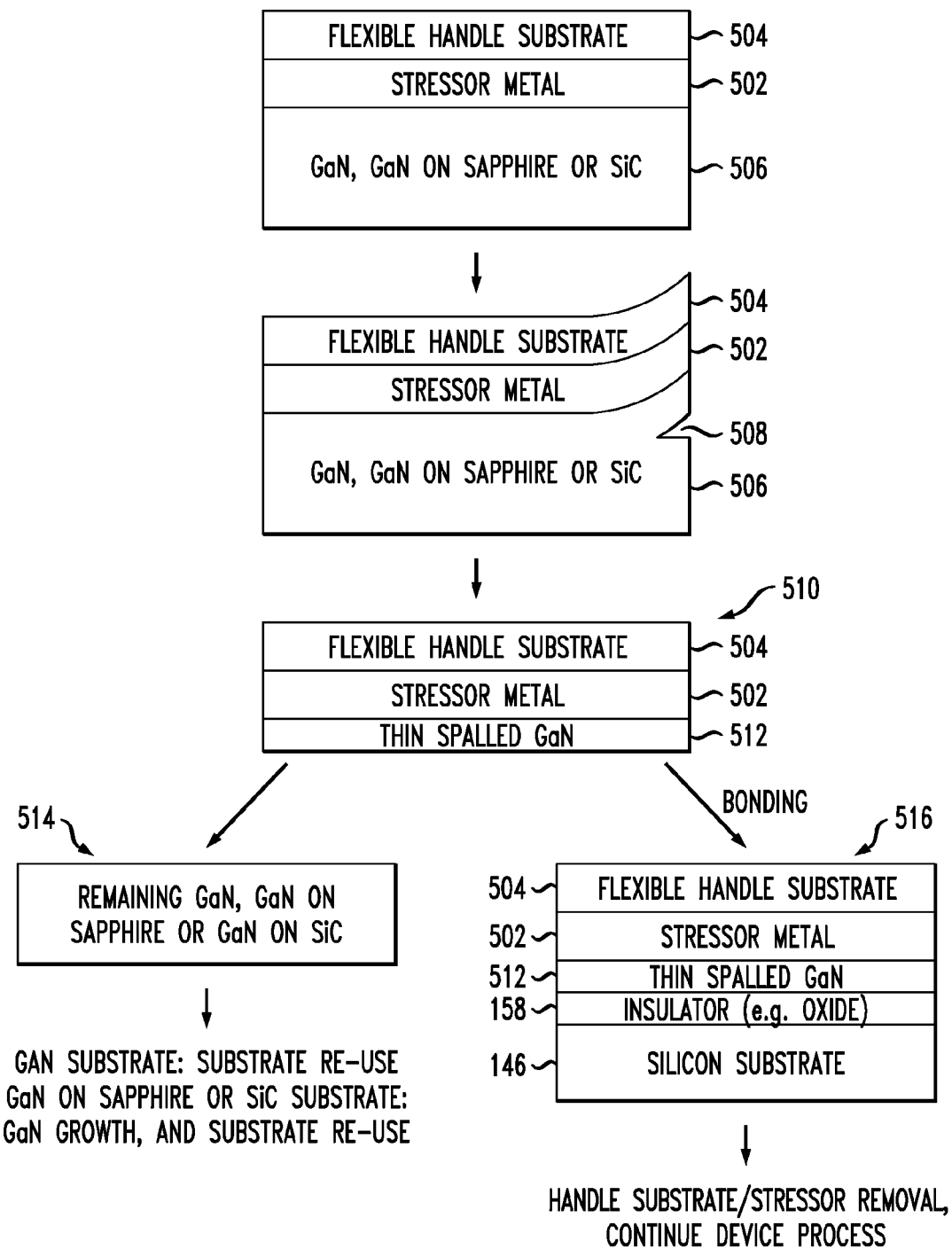
FIG. 9 is a flow diagram showing an exemplary process for fabricating a structure useful for constructing a high electron mobility transfer structure or a Schottky diode structure.
Figure 10:
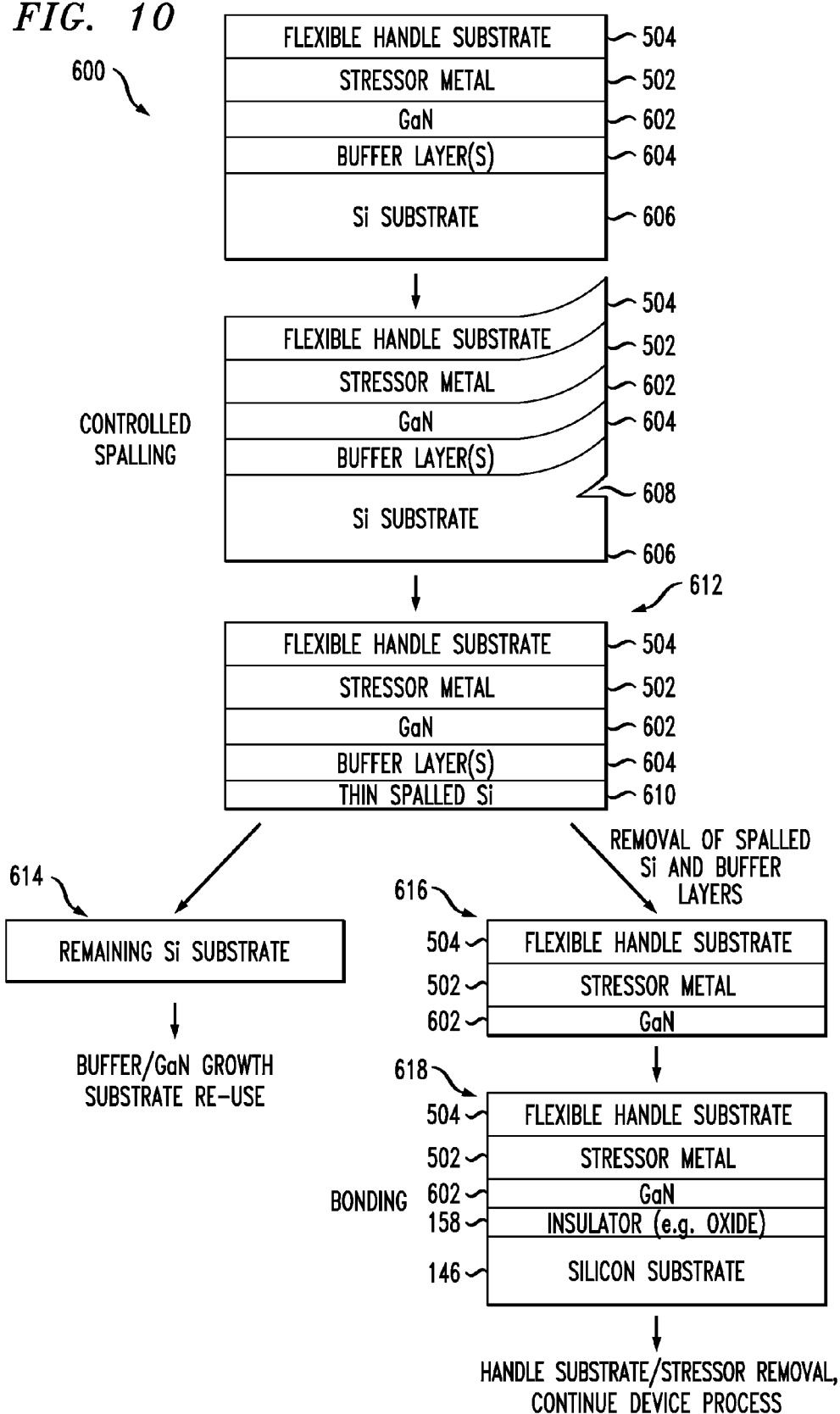
FIG. 10 is a flow diagram showing a further exemplary process for fabricating a structure useful for constructing a high electron mobility transfer structure or a Schottky diode structure.
Figure 11:
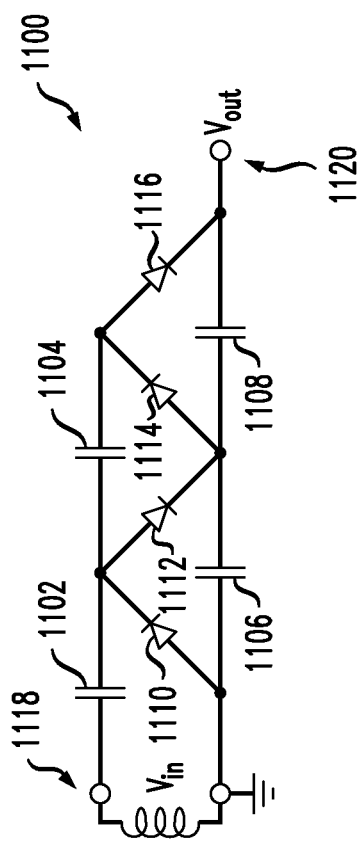
FIG. 11 is a Cockcroft-Walton (CW) AC-to-DC converter, according to the prior art.

FIGS. 9 and 10 show schematic illustrations of exemplary processes that may be used entirely or in part to fabricate one or more of the HEMT or diode structures disclosed herein, it being appreciated that other processes could instead be employed. Referring to FIG. 9, a stressor metal layer 502 and a flexible handle substrate 504 are formed on an initial substrate 506. The initial substrate may comprise, for example, gallium nitride or gallium nitride on sapphire or silicon carbide. The flexible handle substrate 504 can be a flexible adhesive. The flexible handle substrate is used to cause tensile stress in the metal layer (e.g. nickel) to form a fracture 508 in the initial substrate 504. Two elements remain following this procedure, one 510 comprising the flexible handle substrate, the stressor metal layer 502 and a thin spalled gallium nitride layer 512, the other 514 comprising the remaining portion of the initial substrate 506. If the initial substrate is gallium nitride, it can be reused by forming another stressor metal layer on it followed by formation of a flexible handle substrate. If the initial substrate is gallium nitride on sapphire or silicon carbide, a gallium nitride layer can again be grown on the remaining portion of the initial substrate followed by deposition of the stressor metal layer and flexible handle substrate prior to reuse for the same procedure.

The element 510 including the thin spalled gallium nitride layer 512 is further processed to add, for example, an insulator layer 158 and a silicon substrate layer 146 such as those described with respect to the exemplary embodiment of FIG. 4. The flexible handle substrate 504 and stressor metal layer 502 are removed from this element 516 followed by further processing to form a superjunction layer if necessary and, using the example of FIG. 4, add the barrier layer, passivation layer, and electrodes.

FIG. 10 shows a process similar to that shown in FIG. 9, but starts with a different initial structure 600 and is preferred. The initial structure 600 includes a flexible handle substrate 504 and a stressor metal layer 502 formed on a gallium nitride layer 602. A buffer layer 604 is positioned between the gallium nitride layer 602 and a silicon substrate 606 (e.g. Si(111)). As discussed above, aluminum nitride may be employed as a buffer layer. A fracture 608 is formed in the silicon substrate 606, resulting in a first structure 612 including a thin spalled silicon layer 610 and the other layers 502, 504, 602, 604 discussed above and the remaining portion 614 of the silicon substrate 606. The spalled silicon and buffer layers 604, 610 can be removed to form a third structure 616 including the gallium nitride layer, stressor metal layer and flexible handle substrate. The third structure 616 can be bonded to the oxide layer 158 to form a fourth structure 618 similar to the structure 516 shown in FIG. 9. The flexible handle substrate and stressor metal layer can be removed followed by further processing to obtain, for example, the structure shown in FIG. 4. The superjunction can be formed either before or after spalling. It is also possible to form the superjunction, grow the barrier layer, and then conduct the spalling procedure. The principles of the techniques shown in FIGS. 9 and 10 can be applied to the fabrication of the Schottky diode structures discussed above with respect to FIGS. 5-8.

The aforementioned exemplary voltage-multiplying circuits will now be described in detail with respect to FIGS. 12-16. Circuit 1200 of FIG. 12 includes transistor M1, numbered 1204, and transistor M2, numbered 1212. Note that transistor labels M1, M2, M3, M4, and M5; current symbols, and voltage symbols are re-used in FIGS. 12-16 and are not necessarily identical in the different figures; unique reference characters are employed as appropriate to avoid confusion. The two transistors 1204, 1212 together form an effective three-terminal device that can be substituted for a single transistor; the overall drain is the drain 1202 of transistor 1204; the overall gate is the gate 1206 of transistor 1204; and the overall source is the source 1210 of transistor 1212. The source of transistor 1204 is coupled to the drain of transistor 1212 at 1208, and transistor 1212 is diode connected so that its gate is also connected to node 1208. In circuit 1200 of FIG. 12, the gate voltage $V_G$ is divided equally (assuming the same channel width to length ratios (W/L for the two transistors) between the two transistors M1 and M2. (Note it is also assumed, by way of a non-limiting illustrative simplification, that the two transistors have the same (or close) threshold voltages in order for the gate voltage to be divided equally across the two transistors. In an integrated circuit, typically all the transistors have the same (or very close) threshold voltages). If circuit 1200 is used as a diode-connected transistor, i.e. the overall drain 1202 is connected to the overall gate 1206, dividing the gate voltage equally between the two transistors M1 and M2 as described above allows an upper limit of a twofold increase in the breakdown voltage, while the drive current is unchanged for a given W/L.

Figure 13:
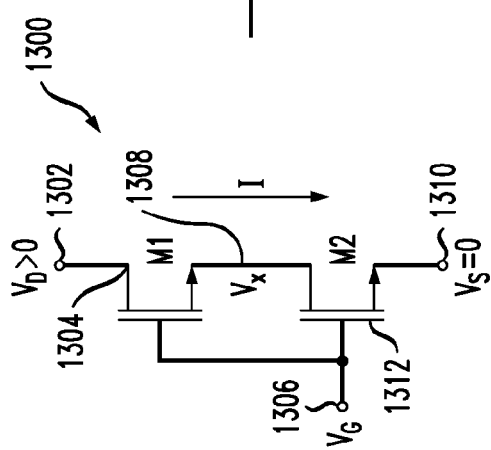

Circuit 1300 of FIG. 13 includes transistor M1, numbered 1304, and transistor M2, numbered 1312. The two transistors 1304, 1312 together form an effective three-terminal device that can be substituted for a single transistor; the overall drain is the drain 1302 of transistor 1304; the overall gate 1306 is connected to the gates of both transistors 1304, 1312; and the overall source is the source 1310 of transistor 1312. The source of transistor 1304 is coupled to the drain of transistor 1312 at 1308. In circuit 1300 of FIG. 13, the load transistor 1304 is biased in the linear mode, while the driver transistor 1312 is in saturation. The drain voltage of transistor 1312 is thus reduced from $V_D$ to $V_X$, reducing the electric field on the drain side of the gate and therefore reducing the off-current of the device while the on-current is not affected. In addition, breakdown between the gate and drain of the transistor 1312 is suppressed due to the reduced voltage of node 1308. The W/L ratio of the load transistor 1304 may be chosen large enough to allow sufficiently low access resistance. Circuits 1200 and 1300 may be combined as in circuit 1400 of FIG. 14, and may offer the advantages of both circuits 1200 and 1300.

Figure 15:
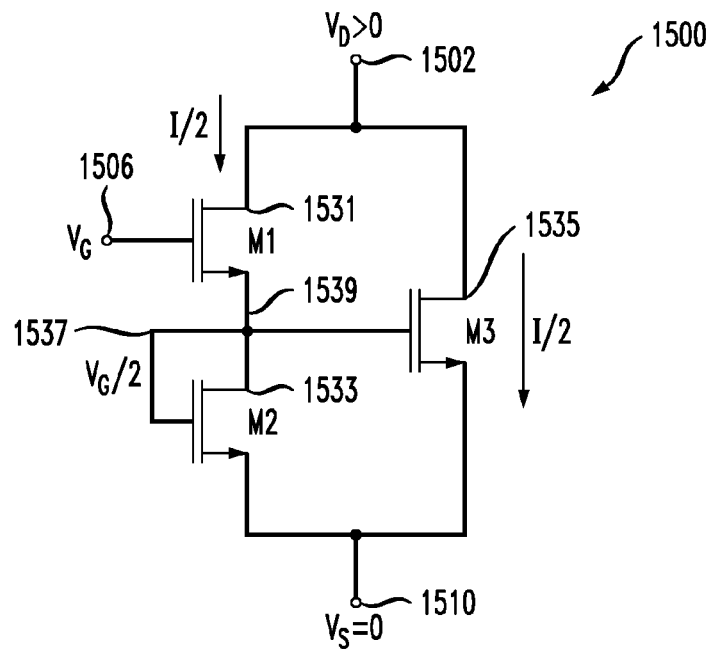
Figure 16:
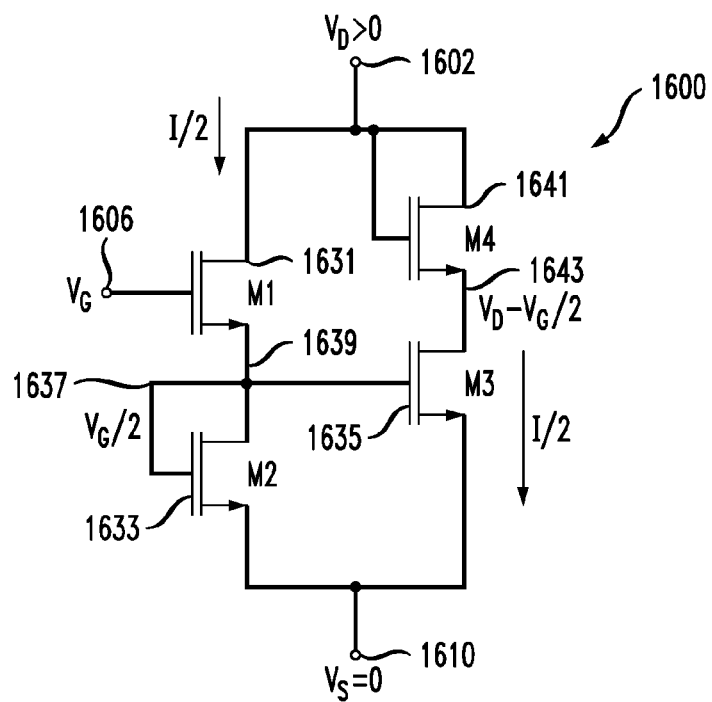

Circuits 1500 of FIGS. 15 and 1600 of FIG. 16 show solutions for doubling the breakdown voltage in diode-connected configurations and also doubling the drive current (W/L ratios are again assumed the same for all transistors). Circuit 1600 offers a lower gate-drain voltage on transistor M3, numbered 1635 (and thus a lower chance of breakdown and higher reliability) at the cost of an extra diode-connected transistor, M4, numbered 1641.

Each of the circuits 1200, 1300, 1400, 1500, 1600 can be viewed as a black-box with three terminals similar to that of an individual transistor with three terminals. Therefore, embodiments of the invention contemplate the combination of these circuits such that one of the disclosed circuits 1200, 1300, 1400, 1500, or 1600 is used instead of an individual transistor component in the same circuit or in another one of the disclosed circuits 1200, 1300, 1400, 1500, or 1600.

By way of review and provision of additional detail, the breakdown voltage of GaN HEMT devices is typically limited to 2 KV because of premature breakdown due to the gate-drain electric field. GaN-on-Si devices also suffer from premature breakdown through the Si substrate. Higher breakdown voltages are desired for power electronics applications (for example, >10 KV within 10 years). One or more embodiments advantageously provide exemplary circuit structures to increase the breakdown voltage of integrated devices formed from individual devices with lower breakdown voltages, without compromising drive current. Further, one or more instances provide such circuit structures in which the transistor devices are GaN-on-Si HEMT or MIS-HEMT devices; for example, of the kinds described above. Yet further, one or more embodiments are directed to a method of forming the exemplary (integrated) circuit structures to increase the breakdown voltage of integrated devices, wherein the integrated circuit is fabricated first, and then bonded onto an insulating substrates by controlled spalling as described above.

One or more embodiments advantageously provide circuit structures which permit application of higher gate voltage and/or higher drain voltage on the three-terminal device, as compared to a single transistor. If a transistor is to be used only as a switching device, high voltages are required on the drain but not on the gate. High gate voltages are required both on the drain and on the gate when the transistor is to be used as a diode where the gate is coupled to the drain. Circuits which allow applying more voltage to the gate are therefore particularly advantageous in gated diode applications. For example, circuit 1300 allows putting more voltage on the drain and therefore can be used as a high-voltage transistor; however, it does not address the gate voltage; it just improves the breakdown voltage of the transistor operating as a transistor. On the other hand, circuit 1200 allows applying more voltage on the gate and is therefore useful for diode-connected applications. Circuit 1400 allows use of higher voltage on both the gate and the drain.

One or more embodiments are useful in high voltage transistor applications. As used herein, a high voltage transistor includes silicon power MOSFETs, power MOSFETs of other materials, high electron mobility transistors, and the like, operating at a drain voltage greater than or equal to 1 KV (and also for the gate voltage if diode-connected). One or more circuits improve the breakdown voltage of the individual transistors. Breakdown voltage is that voltage where the semiconductor fails as a dielectric.

Figure 12:
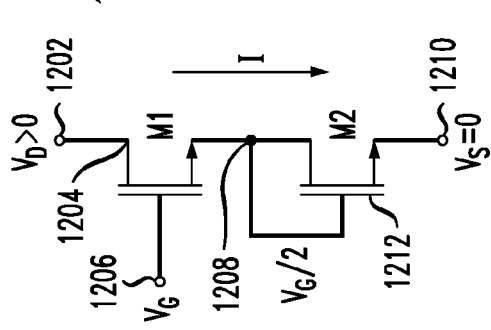

Turning again to circuit 1200 of FIG. 12, transistor 1204 is biased at saturation and is in series with diode-connected transistor 1212, which has to be in saturation because it is connected as a diode. Purely for purposes of descriptive simplicity, assume both transistors are dimensionally identical, i.e., same width W and same length L. Since they are series connected, they have the same current I and thus the same gate-source voltage $V_{GS}$, which in turn implies that the gate voltage of transistor 1212 is $V_G/2$ (assuming $V_S$ is grounded, i.e. $V_S=0$). Therefore, both transistor 1204 and transistor 1212 are carrying a voltage of $V_G/2$ instead of $V_G$, effectively breaking in half the voltage that must be tolerated by each transistor. That is, viewing the circuit 1200 as a three-terminal device to be substituted for a single transistor, each actual transistor 1204, 1212 sees half the overall voltage seen by the three-terminal circuit 1200. A variety of transistors can be used for transistor 1204; one non-limiting example is the above-mentioned superjunction GaN HEMT high electron mobility transistor. Similarly, a variety of transistors can be used for diode-connected transistor 1212; one non-limiting example is the above-described Schottky diode; another non-limiting example is the above-mentioned superjunction GaN HEMT high electron mobility transistor with the gate and drain connected; the latter approach is presently preferred.

Consider again circuit 1300 of FIG. 13. There are two transistors 1304, 1312 which share a gate terminal 1306. The drain 1302 of transistor 1304 is the "overall" drain of the three-terminal circuit, the source 1310 of transistor 1312 is the "overall" source of the three-terminal circuit, and the coupled gates 1306 are the "overall" gate of the three-terminal circuit. Because the two transistors 1304, 1312 are in series, they must have the same current, I. From equations for modeling field effect transistors, which equations are in themselves well known to the skilled artisan, it can be shown that the top transistor 1304 is in the linear mode (triode region) and the bottom transistor 1312 is in the saturation mode (see, e.g., Sedra and Smith, Microelectronic Circuits, Third Edition, Oxford University Press, New York, 1991, pages 298-317, expressly incorporated by reference herein for all purposes). With the top transistor 1304 in the linear mode, there is a voltage $V_X$ at node 1308 between transistor 1304 and transistor 1312, which is lower than the (overall) drain voltage $V_D$, but higher than the overall source voltage $V_S$. Transistor 1312 now has a lower gate-to-drain voltage because $V_X$ is lower than $V_D$. A variety of transistors can be used for both transistors 1304 and 1312; one non-limiting example is the above-mentioned superjunction GaN HEMT high electron mobility transistor.

Figure 14:
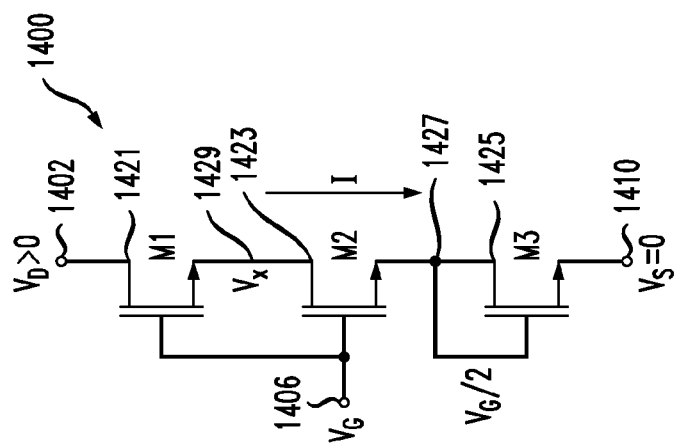
FIGS. 12-16 are, respectively, first through fifth exemplary voltage-multiplying circuits, using n-channel devices, according to aspects of the invention.

Circuit 1400 of FIG. 14 includes transistor M1, numbered 1421; transistor M2, numbered 1423; and transistor M3, numbered 1425. The three transistors 1421, 1423, 1425 together form an effective three-terminal device that can be substituted for a single transistor; the overall drain is the drain 1402 of transistor 1421; the overall gate is the gate 1406 common to transistors 1421, 1423; and the overall source is the source 1410 of transistor 1425. The source of transistor 1421 is coupled to the drain of transistor 1423 at 1429, and transistor 1425 is diode connected so that its gate is connected to its drain and the source of transistor 1423 at node 1427.

In circuit 1400 of FIG. 14, transistor 1312 of circuit 1300 is replaced with circuit 1200. Transistors 1421, 1423, and 1425 are all in series so the same current I flows in all three. The gate voltage divides in half on the gate of transistor 1425 and $V_X$ is present at node 1429 between transistors 1421 and 1423. A variety of transistors can be used for both transistors 1421 and 1423; one non-limiting example is the above-mentioned superjunction GaN HEMT high electron mobility transistor. Similarly, a variety of transistors can be used for diode-connected transistor 1425; one non-limiting example is the above-described Schottky diode; another non-limiting example is the above-mentioned superjunction GaN HEMT high electron mobility transistor with the gate and drain connected; the latter approach is presently preferred.

Consider again circuit 1500 of FIG. 15. Circuit 1500 of FIG. 15 includes transistor M1, numbered 1531; transistor M2, numbered 1533; and transistor M3, numbered 1535. The three transistors 1531, 1533, 1535 together form an effective three-terminal device that can be substituted for a single transistor; the overall drain is the drain 1502 of both transistor 1531 and transistor 1535; the overall gate is the gate 1506 of transistor 1531; and the overall source is the source 1510 of transistors 1533 and 1535. The source of transistor 1531 is coupled to the drain of transistor 1533 at 1539, and transistor 1533 is diode connected so that its gate 1537 is also connected to node 1539 (and also to the gate of transistor 1535).

Circuit 1500 is similar to circuit 1200 with transistor 1535 added in parallel. This allows toleration of twice as much overall current as compared to circuit 1200; transistor 1535 is biased at the same gate-source voltage as transistor 1533. Again assume for simplicity that the transistors are dimensionally identical. All the transistors 1531, 1533, and 1535 are in the saturation mode.

Consider again circuit 1600 of FIG. 16. Circuit 1600 of FIG. 16 includes transistor M1, numbered 1631; transistor M2, numbered 1633; transistor M3, numbered 1635; and transistor M4, numbered 1641. The four transistors 1631, 1633, 1635, 1641 together form an effective three-terminal device that can be substituted for a single transistor; the overall drain is the drain 1602 of both transistor 1631 and transistor 1641; the overall gate is the gate 1606 of transistor 1631; and the overall source is the source 1610 of transistors 1633 and 1635. The source of transistor 1631 is coupled to the drain of transistor 1633 at 1639, and transistor 1633 is diode connected so that its gate 1637 is also connected to node 1639 (and also to the gate of transistor 1635). The source of transistor 1641 is connected to the drain of transistor 1635 at node 1643.

Circuit 1600 of FIG. 16 is similar to circuit 1500 of FIG. 15, but adds additional transistor 1641 so that transistor 1635 sees a lower drain-to-gate voltage. In circuit 1500, transistor 1535 sees a drain-to-gate voltage of $V_D-V_G/2$ (assuming $V_S$ is grounded, i.e. $V_S=0$). In circuit 1600, transistor 1635 sees a drain to gate voltage of $V_D-V_G$, which is lower, as compared to circuit 1500, by $V_G/2$ (note that $(V_D-V_G/2)-V_G/2=V_D-V_G$).

Once again, with regard to circuits 1500 and 1600, a variety of transistors can be used for the non-diode-connected transistors; one non-limiting example is the above-mentioned superjunction GaN HEMT high electron mobility transistor; also, once again, a variety of transistors can be used for the diode-connected transistors; one non-limiting example is the above-described Schottky diode; another non-limiting example is the above-mentioned superjunction GaN HEMT high electron mobility transistor with the gate and drain connected; the latter approach is presently preferred.

One or more embodiments are realized using HEMT and/or MOSFET devices rather than bipolar junction transistors. Furthermore, one or more embodiments do not require both enhancement and depletion type (or both n-channel and p-channel) devices, but rather can be realized by only one type of transistors (i.e., n- or p-channel).

Additional embodiments provide corresponding methods, including methods of designing, operating, and fabricating.

Thus, FIGS. 12-16 are, respectively, first through fifth exemplary voltage-multiplying circuits, using n-channel devices, according to aspects of the invention. On the other hand, FIGS. 18-22 are, respectively, sixth through tenth exemplary voltage-multiplying circuits, analogous to those in FIGS. 12-16 but using p-channel devices, according to aspects of the invention. Elements in FIGS. 18-22 analogous to those in FIGS. 12-16 have received the same reference characters, incremented by six hundred. The structures are the same, but the polarity of the power supply lines is reversed; i.e. in the case of n-channel devices, $V_D>V_S$, so if $V_S$ is grounded, $V_D>0$, but in the case of p-channel devices, $V_D<V_S$, so if $V_S$ is grounded, $V_D<0$. Also note than in the case of n-channel devices, $V_G>0$, but in the case of p-channel devices, $V_G<0$.

Figure 18:
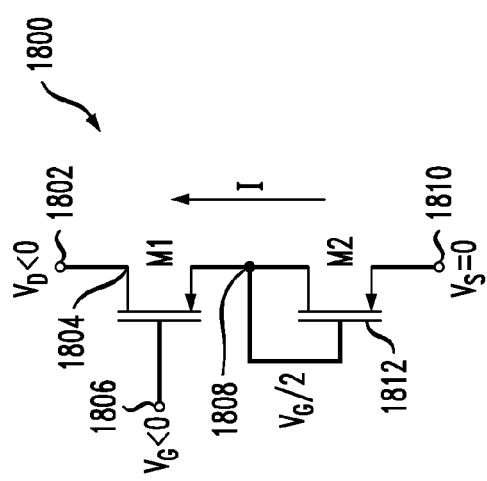
Figure 21:
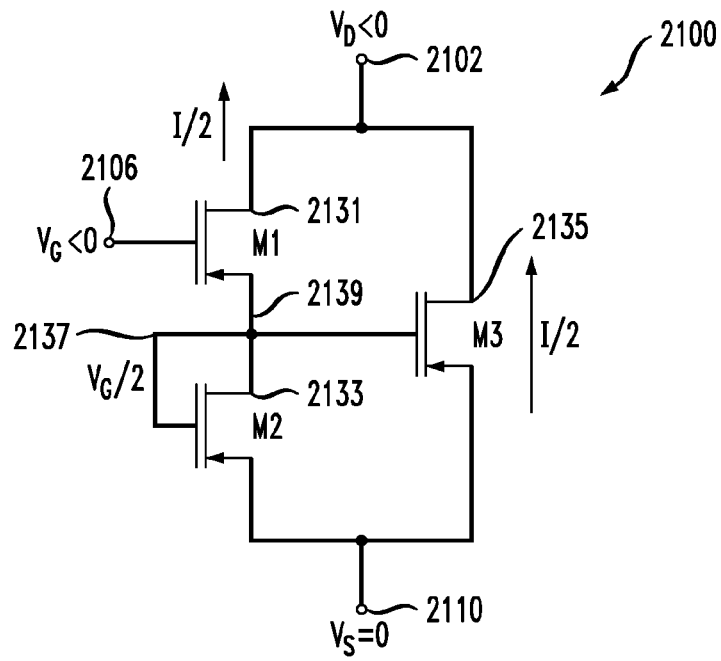
Figure 22:
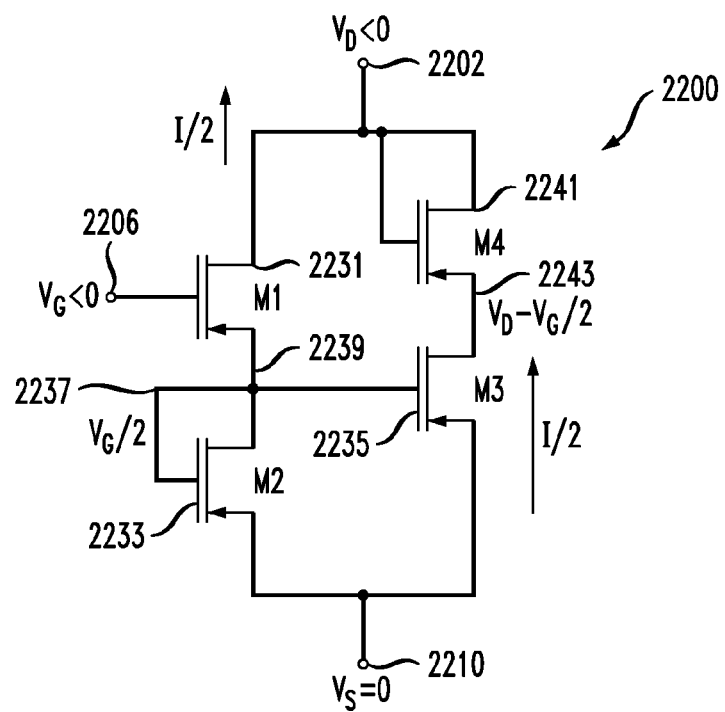
Figure 23:
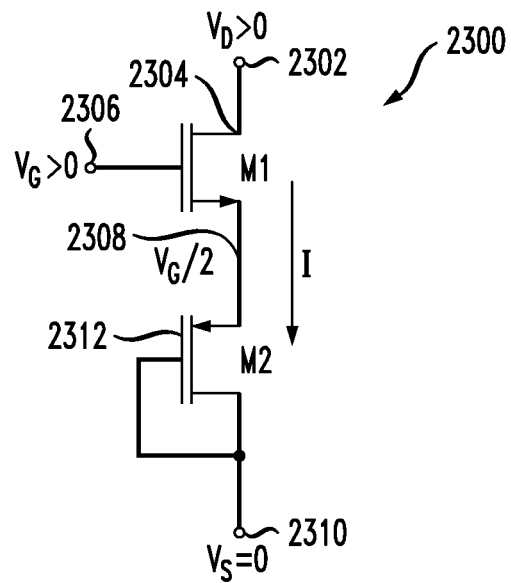
FIGS. 23 and 24 are, respectively, eleventh and twelfth exemplary voltage-multiplying circuits, analogous to those in FIGS. 12 and 18 but using both n- and p-channel devices, according to aspects of the invention.
Figure 24:
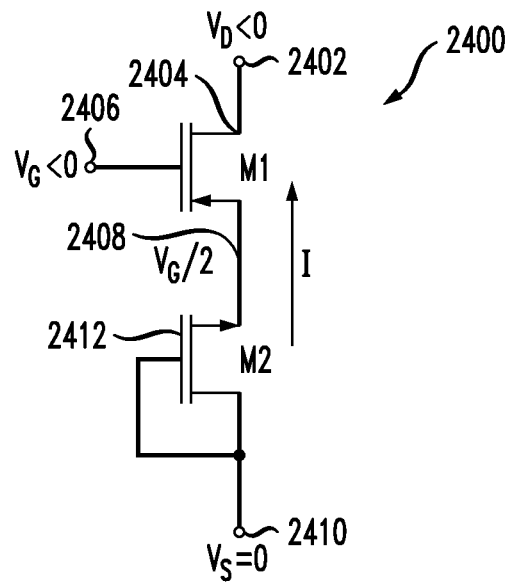

FIGS. 23 and 24 are, respectively, eleventh and twelfth exemplary voltage-multiplying circuits, analogous to those in FIGS. 12 and 18 but using both n- and p-channel devices, according to aspects of the invention. In this regard, although one or more embodiments are focused on circuits including only n-channel or only p-channel devices, it will be appreciated by those skilled in the art that the same function intended by the disclosed circuits may be accomplished by circuits including both types of transistors. However, from the integration point of view, including two types of transistors increases the process complexity (in particular the number of steps required for device fabrication) significantly and therefore circuits including only a single transistor type are preferred. Nevertheless, circuits including two types of transistors are also within the scope of this invention. For example, a diode connected transistor may have an opposite channel type as that of the other transistors, as shown in FIGS. 23 and 24. Elements in FIG. 23 analogous to those in FIG. 12 have received the same reference character, incremented by eleven hundred, and elements in FIG. 24 analogous to those in FIG. 18 have received the same reference character, incremented by six hundred. Note, however, in this regard that node 1208 in FIG. 12 and node 1808 in FIG. 18 represent the source of M1, drain of M2, and gate of M2, all coupled together. However, the diode-connected transistors in FIGS. 23 and 24 have their gates coupled to their sources, such that node 2308 in FIG. 23 and node 2408 in FIG. 24 represent the source of M1 and drain of M2 coupled together.

Attention should again be given to FIG. 12. Given the discussion thus far, it will be appreciated that, in general terms, an exemplary circuit, according to an aspect of the invention, includes a first field effect transistor 1204 having a gate 1206, a first drain-source terminal 1202, and a second drain-source terminal 1208. The first field effect transistor is an n-channel transistor or a p-channel transistor. Also included is a second field effect transistor 1212 having a gate 1208, a first drain-source terminal 1208, and a second drain-source terminal 1210. The second field effect transistor is of the same type as the first, i.e., p-channel if the first is p-channel and n-channel if the first is n-channel. The second drain-source terminal 1208 of the first field effect transistor is coupled to the first drain-source terminal 1208 of the second field effect transistor (these two terminals and the gate of transistor 1212 are all referred to as reference character 1208 since they are interconnected at that node). The gate of the second field effect transistor is coupled to the first drain-source terminal of the second field effect transistor at 1208, as noted.

Optionally, the width of the first and second transistors is identical and the length of the first and second transistors is identical.

In some instances, such as the example shown in FIG. 12, both transistors are n-channel.

In one or more embodiments, the first drain-source terminal 1202 of the first transistor 1204 is a drain terminal, the second drain-source terminal of the first transistor 1204 is a source terminal, the first drain-source terminal of the second transistor 1212 is a drain terminal, and the second drain-source terminal 1210 of the second transistor 1212 is a source terminal.

As noted, in some cases, both transistors are high electron mobility transistor structures as described above.

In one or more embodiments, all the devices share the same barrier layer material, GaN material, buffer material(s) (if present), and substrate. These layers are grown first, and then patterned into individual devices by isolation etch, i.e. by etching the barrier layer and the GaN layer, and optionally the buffer layer, in between the defined device areas, using known lithography and etching techniques. Typically, the gate, source and drain terminals are formed after device isolation, but this order may be reversed. After the device isolation, and source, drain and gate formation, a passivation layer is formed on top of the fabricated devices (which are isolated from each other). Contact vias are opened in the passivation layer to access the source, gate and drain terminals of the devices as necessary followed by metal deposition and patterning to form metal interconnect lines between devices and implement the desired circuits. Depending on the circuit complexity and/or layout, additional passivation/metallization levels may be necessary as known in the art. Note, however, that the circuits and/or structures disclosed herein are not restricted to integrated circuit (IC) implementations, although implementation as ICs is preferred.

Thus, in some cases, the first field effect transistor is a first high electron mobility transistor structure, which in turn includes a first doped gallium nitride superjunction layer 44 or 144 having a first plurality of p/n junctions. A first barrier layer adjoins the first doped gallium nitride superjunction layer, and the doped gallium nitride superjunction layer is positioned between a substrate layer 46 or 146 and the barrier layer 42 or 142. Also included are a first source electrode 52 or 152, comprising the source terminal of the first field effect transistor; a first drain electrode 54 or 154, comprising the drain terminal of the first field effect transistor; and a first gate electrode 50 or 150, comprising the gate of the first field effect transistor. A first passivation layer overlies the first barrier layer (not shown). An electric field set up by the first doped gallium nitride superjunction layer is vertical to an electric field set up between the first gate electrode and the first drain electrode upon application of a voltage to the first gate electrode.

Similarly, the second field effect transistor is a second high electron mobility transistor structure, which in turn includes a second doped gallium nitride superjunction layer 44 or 144 having a second plurality of p/n junctions. A second barrier layer adjoins the second doped gallium nitride superjunction layer, and the doped gallium nitride superjunction layer is positioned between a substrate layer 46 or 146 and the barrier layer 42 or 142. Note throughout that notations such as "first" and "second" are used for convenience to distinguish portions of the transistors but as noted above, in IC implementations, may simply refer to different portions of shared barrier layer material, shared GaN material, shared buffer material(s) (if present), and shared substrate. Also included are a second source electrode 52 or 152, comprising the source terminal of the second field effect transistor; a second drain electrode 54 or 154, comprising the drain terminal of the second field effect transistor; and a second gate electrode 50 or 150, comprising the gate of the second field effect transistor. A second passivation layer overlies the second barrier layer. An electric field set up by the second doped gallium nitride superjunction layer is vertical to an electric field set up between the second gate electrode and the second drain electrode upon application of a voltage to the second gate electrode.

Furthermore, in some cases, the first field effect transistor is a first high electron mobility transistor structure, which in turn includes a first doped gallium nitride superjunction layer having a thickness of less than ten microns and including a first plurality of p/n junctions. The entirety of the thickness of the first doped gallium nitride superjunction layer comprises a first superjunction structure such as shown in FIGS. 2 and 4. A first aluminum gallium nitride barrier layer adjoins the first doped gallium nitride superjunction layer, and the first doped gallium nitride superjunction layer is positioned between a first silicon substrate layer and the barrier layer. Also included are a first source electrode, comprising the source terminal of the first field effect transistor; a first drain electrode, comprising the drain terminal of the first field effect transistor; and a first gate electrode, comprising the gate of the first field effect transistor. The first doped gallium nitride superjunction layer is operable to suppress breakdown both through the first silicon substrate layer and between the first gate and first drain electrodes.

Similarly, the second field effect transistor is a second high electron mobility transistor structure, which in turn includes a second doped gallium nitride superjunction layer having a thickness of less than ten microns and including a second plurality of p/n junctions. The entirety of the thickness of the second doped gallium nitride superjunction layer comprises a second superjunction structure such as shown in FIGS. 2 and 4. A second aluminum gallium nitride barrier layer adjoins the second doped gallium nitride superjunction layer, and the second doped gallium nitride superjunction layer is positioned between a second silicon substrate layer and the barrier layer. Also included are a second source electrode, comprising the source terminal of the second field effect transistor; a second drain electrode, comprising the drain terminal of the second field effect transistor; and a second gate electrode, comprising the gate of the second field effect transistor. The second doped gallium nitride superjunction layer is operable to suppress breakdown both through the second silicon substrate layer and between the second gate and second drain electrodes.

As noted, diode-connected transistors herein, such as transistor 1212 in FIG. 12, can instead be realized as the above-described Schottky diode structures, such as those shown in FIGS. 5-8. Such a diode structure in turn includes a Schottky contact 250, 250', a substrate 206, 246 having a top surface 206', 246', and a doped gallium nitride superjunction layer 204, 244 between the Schottky contact and the top surface of the substrate. The doped gallium nitride superjunction layer has a thickness of less than ten microns and comprises a plurality of p/n junctions (e.g. 244'). The entirety of the thickness of the doped gallium nitride superjunction layer 204, 244 comprises a superjunction structure. The p/n junctions extending vertically with respect to the top surface of the substrate as illustrated in FIGS. 5 and 6. As shown in FIG. 6, an insulating layer 258 may be provided between the substrate and superjunction layers.

In an integrated circuit, the substrate, buffer layer (e.g. AlN) if present, the second barrier layer (e.g. AlGaN) if present, and the GaN superjunction layers are shared by the Schottky diodes and HEMT devices, but the first (top) barrier layer (e.g. AlGaN) is present only in the HEMT devices and therefore needs to be removed from the areas where diodes are fabricated, after growth. Passivation and metallization processes/layers are the same for both diodes and transistors. Again, note that the circuits and/or structures disclosed herein are not restricted to ICs (although implementation as ICs is preferred).

Referring now to FIG. 14, in some instances, the circuit further includes a third field effect transistor 1421 having a gate, a first drain-source terminal 1402 and a second drain-source terminal 1429. The third field effect transistor is of the same type (p- or n-channel) as the other two. The second drain-source terminal 1429 of the third field effect transistor is coupled to the first drain-source terminal of the first field effect transistor 1423. The gate of the third field effect transistor is coupled to the gate of the first field effect transistor 1406. Note, with respect to FIG. 14, M2 is the "first" transistor, M3 is the "second" transistor, and M1 is the "third" transistor.

Referring now to FIG. 15, in some instances, the circuit further includes a third field effect transistor 1535 having a gate, a first drain-source terminal, and a second drain-source terminal. The third field effect transistor is of the same type (i.e., n- or p-channel) as the other two. The second drain-source terminal of the third field effect transistor is coupled to the second drain-source terminal of the second field effect transistor, at 1510. The gate of the third field effect transistor is coupled to the gate of the second field effect transistor, at 1537. The first drain-source terminal of the first field effect transistor is coupled to the first drain-source terminal of the third field effect transistor, at 1502.

Referring now to FIG. 16, in some instances, the circuit further includes third and fourth field effect transistors, both of the same type (i.e., n- or p-channel) as the other two. The third field effect transistor 1635 has a gate, a first drain-source terminal, and a second drain-source terminal. The fourth field effect transistor 1641 has a gate, a first drain-source terminal, and a second drain-source terminal. The second drain-source terminal of the third field effect transistor is coupled to the second drain-source terminal of the second field effect transistor at 1610. The gate of the third field effect transistor is coupled to the gate of the second field effect transistor at 1637. The first drain-source terminal of the first field effect transistor is coupled to the first drain-source terminal of the fourth field effect transistor, at 1602. The gate of the fourth field effect transistor is coupled to the first drain-source terminal of the fourth field effect transistor (i.e. transistor 1641 is diode-connected). The second drain-source terminal of the fourth field effect transistor is coupled to the first drain-source terminal of the third field effect transistor, at 1643.

Attention should again be given to FIG. 13. Given the discussion thus far, it will be appreciated that, in general terms, another exemplary circuit, according to another aspect of the invention, includes a first field effect transistor 1304 having a gate, a first drain-source terminal, and a second drain-source terminal. Also included is a second field effect transistor 1312 having a gate, a first drain-source terminal, and a second drain-source terminal. Both transistors are of the same type (i.e. n- or p-channel). The second drain-source terminal of the first field effect transistor is coupled to the first drain-source terminal of the second field effect transistor at 1308. The gate of the second field effect transistor is coupled to the gate of the first field effect transistor at 1306.

Optionally, the width of the first and second transistors is identical and the length of the first and second transistors is identical.

In some instances, such as the example shown in FIG. 13, both transistors are n-channel.

In one or more embodiments, the first drain-source terminal 1302 of the first transistor 1304 is a drain terminal, the second drain-source terminal of the first transistor 1304 is a source terminal, the first drain-source terminal of the second transistor 1312 is a drain terminal, and the second drain-source terminal 1310 of the second transistor 1312 is a source terminal.

The first and second field effect transistors can be realized, for example, as first and second high electron mobility transistor structures of any of the kinds described above.

In another aspect, an exemplary method includes determining that a single field effect transistor in a proposed circuit design will suffer breakdown under proposed operating conditions. The single field effect transistor has a gate connected to a first node in the proposed circuit design, a drain connected to a second node in the proposed circuit design, and a source connected to a third node in the proposed circuit design. An additional step includes substituting for the single field effect transistor an equivalent circuit of any of the kinds described herein (taking note that in some instances, diode-connected transistors may be of a different channel type than the other transistors in a circuit; see, e.g., FIGS. 23 and 24), with the "overall" gate, drain, and source of the equivalent circuit respectively connected to the first, second, and third nodes in the proposed circuit design.

Additional steps can include:
  fabricating the proposed circuit design with the equivalent circuit substituted for the single field effect transistor;
  encoding, in a non-transitory manner, in a tangible, computer-readable recordable storage medium, a design structure corresponding to the proposed circuit design with the equivalent circuit substituted for the single field effect transistor; and/or
  operating a physical circuit corresponding to the proposed circuit design with the equivalent circuit substituted for the single field effect transistor.

All of the methods can be carried out, for example, so that the effective breakdown voltage is increased.

One or more exemplary methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Figure 17:
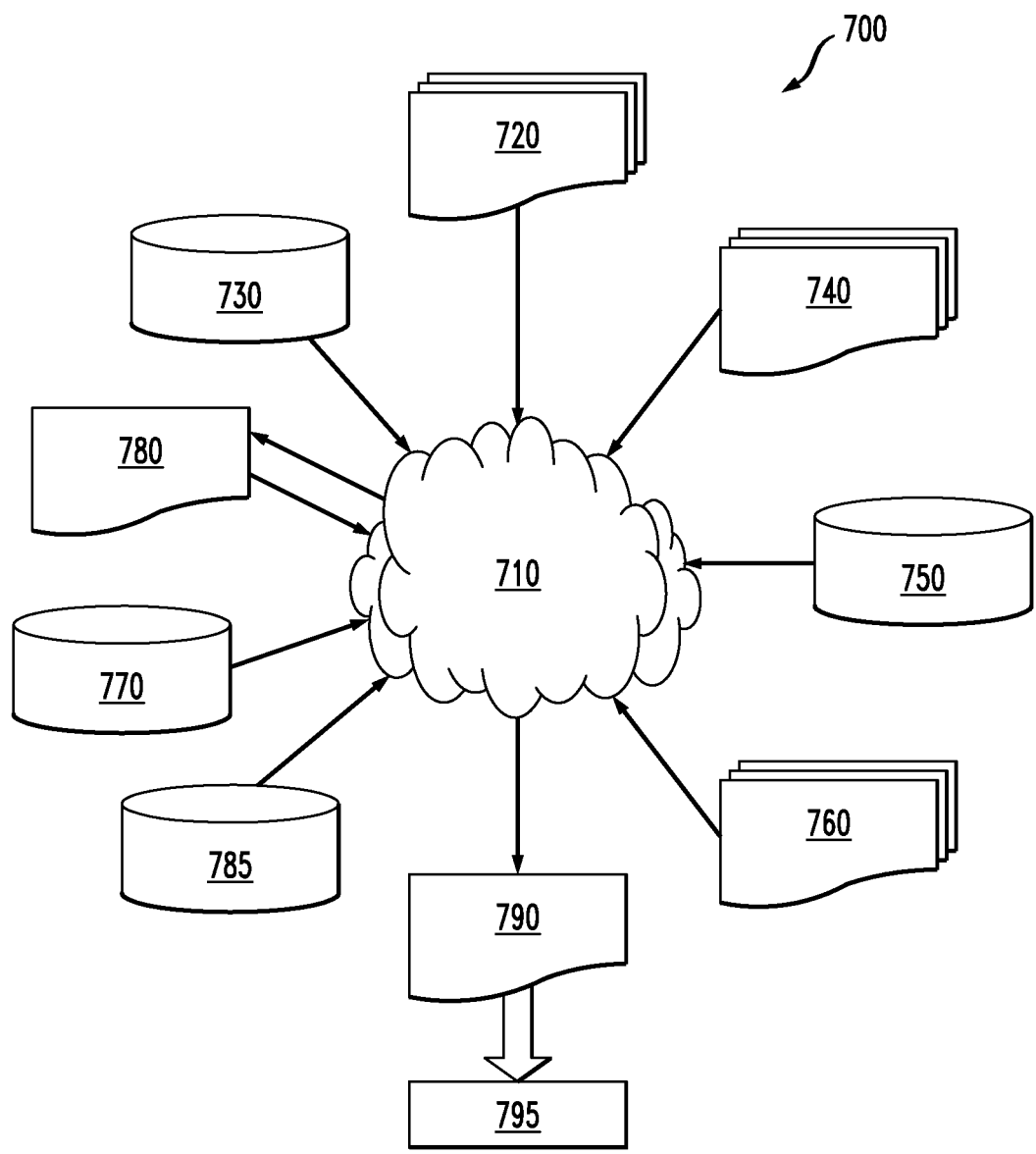
FIG. 17 is a flow diagram of a design process used in semiconductor design, manufacture, and/or test.
Figure 20:
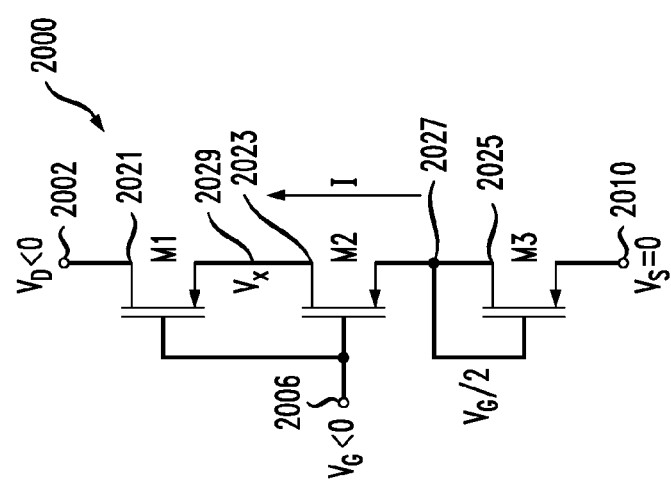
FIGS. 18-22 are, respectively, sixth through tenth exemplary voltage-multiplying circuits, analogous to those in FIGS. 12-16 but using p-channel devices, according to aspects of the invention.
Figure 19:
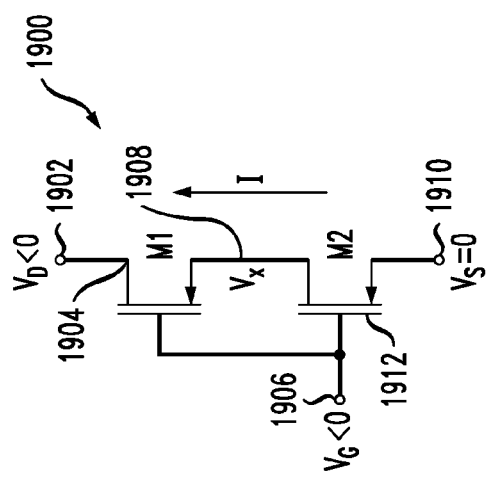

FIG. 17 shows a block diagram of an exemplary design flow 700 used for example, in semiconductor IC logic design, simulation, test, layout, and manufacture. Design flow 700 includes processes, machines and/or mechanisms for processing design structures or devices to generate logically or otherwise functionally equivalent representations of the design structures and/or devices described above and shown in FIGS. 12-16 and 18-24. The design structures processed and/or generated by design flow 700 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 700 may vary depending on the type of representation being designed. For example, a design flow 700 for building an application specific IC (ASIC) may differ from a design flow 700 for designing a standard component or from a design flow 700 for instantiating the design into a programmable array, for example a programmable gate array (PGA) or a field programmable gate array (FPGA) offered by Altera® Inc. or Xilinx® Inc.

FIG. 17 illustrates multiple such design structures including an input design structure 720 that is preferably processed by a design process 710. Design structure 720 may be a logical simulation design structure generated and processed by design process 710 to produce a logically equivalent functional representation of a hardware device. Design structure 720 may also or alternatively comprise data and/or program instructions that when processed by design process 710, generate a functional representation of the physical structure of a hardware device. Whether representing functional and/or structural design features, design structure 720 may be generated using electronic computer-aided design (ECAD) such as implemented by a core developer/designer. When encoded on a machine-readable data transmission, gate array, or storage medium, design structure 720 may be accessed and processed by one or more hardware and/or software modules within design process 710 to simulate or otherwise functionally represent an electronic component, circuit, electronic or logic module, apparatus, device, or system such as those shown in FIGS. 12-16 and 18-24. As such, design structure 720 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 710 preferably employs and incorporates hardware and/or software modules for synthesizing, translating, or otherwise processing a design/simulation functional equivalent of the components, circuits, devices, or logic structures shown in FIGS. 12-16 and 18-24 to generate a Netlist 780 which may contain design structures such as design structure 720. Netlist 780 may comprise, for example, compiled or otherwise processed data structures representing a list of wires, discrete components, logic gates, control circuits, I/O devices, models, etc. that describes the connections to other elements and circuits in an integrated circuit design. Netlist 780 may be synthesized using an iterative process in which netlist 780 is resynthesized one or more times depending on design specifications and parameters for the device. As with other design structure types described herein, netlist 780 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 710 may include hardware and software modules for processing a variety of input data structure types including Netlist 780. Such data structure types may reside, for example, within library elements 730 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 740, characterization data 750, verification data 760, design rules 770, and test data files 785 which may include input test patterns, output test results, and other testing information. Design process 710 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 710 without deviating from the scope and spirit of the invention. Design process 710 may also include modules for performing standard circuit design processes such as timing analysis, verification, design rule checking, place and route operations, etc.

Design process 710 employs and incorporates logic and physical design tools such as HDL compilers and simulation model build tools to process design structure 720 together with some or all of the depicted supporting data structures along with any additional mechanical design or data (if applicable), to generate a second design structure 790. Design structure 790 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 720, design structure 790 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 12-16. In one embodiment, design structure 790 may comprise a compiled, executable HDL simulation model that functionally simulates the devices shown in FIGS. 12-16 and 18-24.

Design structure 790 may also employ a data format used for the exchange of layout data of integrated circuits and/or symbolic data format (e.g. information stored in a GDSII (GDS2), GL1, OASIS, map files, or any other suitable format for storing such design data structures). Design structure 790 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 12-16 and 18-24. Design structure 790 may then proceed to a stage 795 where, for example, design structure 790: proceeds to tape-out, is released to manufacturing, is released to a mask house, is sent to another design house, is sent back to the customer, etc.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A circuit comprising:
    a first field effect transistor having a gate, a drain terminal, and a source terminal, said first field effect transistor comprising one of an n-channel transistor and a p-channel transistor; and
    a second field effect transistor having a gate, a drain terminal, and a source terminal, said second field effect transistor also comprising said one of an n-channel transistor and a p-channel transistor;
    wherein:
    said source terminal of said first field effect transistor is coupled to said drain terminal of said second field effect transistor; and
    said gate of said second field effect transistor is coupled to said drain terminal of said second field effect transistor;
    wherein:
    said drain terminal of said first field effect transistor comprises an overall drain interconnected with external circuitry;
    said gate of said first field effect transistor comprises an overall gate interconnected with said external circuitry;
    said source terminal of said second field effect transistor comprises an overall source interconnected with said external circuitry; and
    said source terminal of said first field effect transistor, said drain terminal of said second field effect transistor, and said gate of said second field effect transistor are not interconnected with said external circuitry.

2. The circuit of claim 1, wherein:
    said first field effect transistor comprises a first high electron mobility transistor structure, in turn comprising:
        a first doped gallium nitride superjunction layer comprising a first plurality of p/n junctions;
        a first substrate layer;
        a first barrier layer adjoining said first doped gallium nitride superjunction layer, said first doped gallium nitride superjunction layer being positioned between said first substrate layer and said first barrier layer;
        a first source electrode, comprising said source terminal of said first field effect transistor;
        a first drain electrode, comprising said drain terminal of said first field effect transistor;
        a first gate electrode, comprising said gate of said first field effect transistor; and
        a first passivation layer overlying said first barrier layer,
    wherein an electric field set up by said first doped gallium nitride superjunction layer is vertical to an electric field set up between said first gate electrode and said first drain electrode upon application of a voltage to said first gate electrode; and
    said second field effect transistor comprises a second high electron mobility transistor structure, in turn comprising:
        a second doped gallium nitride superjunction layer comprising a second plurality of p/n junctions;
        a second substrate layer;
        a second barrier layer adjoining said second doped gallium nitride superjunction layer, said second doped gallium nitride superjunction layer being positioned between said second substrate layer and said second barrier layer;
        a second source electrode, comprising said source terminal of said second field effect transistor;
        a second drain electrode, comprising said drain terminal of said second field effect transistor;
        a second gate electrode, comprising said gate of said second field effect transistor; and
        a second passivation layer overlying said second barrier layer,
    wherein an electric field set up by said second doped gallium nitride superjunction layer is vertical to an electric field set up between said second gate electrode and said second drain electrode upon application of a voltage to said second gate electrode.

3. The circuit of claim 1, wherein:
    said first field effect transistor comprises a first high electron mobility transistor structure, in turn comprising:
        a first doped gallium nitride superjunction layer having a thickness of less than ten microns and comprising a first plurality of p/n junctions, the entirety of the thickness of said first doped gallium nitride superjunction layer comprising a first superjunction structure;
        a first silicon substrate layer;
        a first aluminum gallium nitride barrier layer adjoining said first doped gallium nitride superjunction layer, said first doped gallium nitride superjunction layer being positioned between said first silicon substrate layer and said first aluminum gallium nitride barrier layer;
        a first source electrode, comprising said source terminal of said first field effect transistor;
        a first drain electrode, comprising said drain terminal of said first field effect transistor;
        a first gate electrode, comprising said gate of said first field effect transistor, said first doped gallium nitride superjunction layer being operable to suppress breakdown both through said first silicon substrate layer and between said first gate and first drain electrodes; and
    said second field effect transistor comprises a second high electron mobility transistor structure, in turn comprising:
        a second doped gallium nitride superjunction layer having a thickness of less than ten microns and comprising a second plurality of p/n junctions, the entirety of the thickness of said second doped gallium nitride superjunction layer comprising a second superjunction structure;
a second silicon substrate layer;
a second aluminum gallium nitride barrier layer adjoining said second doped gallium nitride superjunction layer, said second doped gallium nitride superjunction layer being positioned between said second substrate layer and said second aluminum gallium nitride barrier layer;
a second source electrode, comprising said source terminal of said second field effect transistor;
a second drain electrode, comprising said drain terminal of said second field effect transistor;
a second gate electrode, comprising said gate of said second field effect transistor, said second doped gallium nitride superjunction layer being operable to suppress breakdown both through said second silicon substrate layer and between said second gate and second drain electrodes.

4. The circuit of claim 1, wherein said second field effect transistor comprises a Schottky diode structure, in turn comprising:
a Schottky contact;
a substrate having a top surface, and
a doped gallium nitride superjunction layer between said Schottky contact and said top surface of said substrate, said doped gallium nitride superjunction layer having a thickness of less than ten microns and comprising a plurality of p/n junctions, the entirety of the thickness of said doped gallium nitride superjunction layer comprising a superjunction structure, said p/n junctions extending vertically with respect to said top surface of said substrate.

5. The circuit of claim 1, wherein said first and second field effect transistors have an identical length, width, current, and gate-source voltage, and wherein an overall drain voltage is at least 1 kV.

* * * * *